(12) United States Patent
Fuwa et al.

(10) Patent No.: US 10,287,672 B2
(45) Date of Patent: May 14, 2019

(54) HARD COATING, HARD-COATED MEMBER, THEIR PRODUCTION METHODS, AND TARGET USED FOR PRODUCING HARD COATING

(71) Applicant: Mitsubishi Hitachi Tool Engineering, Ltd., Tokyo (JP)

(72) Inventors: Ryoutarou Fuwa, Narita (JP); Kazuyuki Kubota, Yasu (JP); Yuuzoh Fukunaga, Narita (JP)

(73) Assignee: Mitsubishi Hitachi Tool Engineering, Ltd., Tokyo (JP)

( * ) Notice: Subject to any disclaimer, the term of this patent is extended or adjusted under 35 U.S.C. 154(b) by 158 days.

(21) Appl. No.: 15/315,464

(22) PCT Filed: Mar. 26, 2015

(86) PCT No.: PCT/JP2015/059456
§ 371 (c)(1),
(2) Date: Dec. 1, 2016

(87) PCT Pub. No.: WO2015/186413
PCT Pub. Date: Dec. 10, 2015

(65) Prior Publication Data
US 2017/0088937 A1 Mar. 30, 2017

(30) Foreign Application Priority Data
Jun. 2, 2014 (JP) .................................. 2014-114107

(51) Int. Cl.
*C23C 14/34* (2006.01)
*C22C 1/05* (2006.01)
(Continued)

(52) U.S. Cl.
CPC .......... *C23C 14/3414* (2013.01); *C22C 1/05* (2013.01); *C22C 32/00* (2013.01); *C23C 14/024* (2013.01);
(Continued)

(58) Field of Classification Search
USPC .............. 204/192.1, 192.15, 192.16, 298.05, 204/298.13; 428/697, 698, 699;
(Continued)

(56) References Cited

U.S. PATENT DOCUMENTS 5,208,102 A * 5/1993 Schulz ................ C23C 14/0635
428/697
6,750,542 B2   6/2004 Suzuki et al.
7,455,755 B2  11/2008 Tuymer et al.
7,943,017 B2   5/2011 Ramm et al.
2003/0116849 A1   6/2003 Suzuki et al.
2007/0000772 A1   1/2007 Ramm et al.
(Continued)

FOREIGN PATENT DOCUMENTS

JP       10-251831   * 10/1998
JP     2007-046103   *  2/2007
(Continued)

OTHER PUBLICATIONS

International Search Report of PCT/JP2015/059456, dated Jun. 16, 2015 [PCT/ISA/210].

*Primary Examiner* — Archene A Turner
(74) *Attorney, Agent, or Firm* — Sughrue Mion, PLLC

(57) ABSTRACT

An arc-ion-plated hard coating having a composition represented by $(Al_xTi_yW_z)_aN_{(1-a-b)}O_b$, wherein x, y, z, a and b are numbers meeting by atomic ratio $0.6 \leq x \leq 0.8$, $0.05 \leq y \leq 0.38$, $0.02 \leq z \leq 0.2$, $x+y+z=1$, $0.2 \leq a \leq 0.8$, and $0.02 \leq b \leq 0.10$), and having W—O bonds with substantially no Al—O bonds when identified by X-ray photoelectron spectroscopy, and having only a NaCl-type structure in an X-ray diffraction pattern.

11 Claims, 10 Drawing Sheets

(51) Int. Cl.
- *C22C 32/00* (2006.01)
- *C23C 14/06* (2006.01)
- *C23C 14/08* (2006.01)
- *C23C 14/16* (2006.01)
- *C23C 14/02* (2006.01)
- *C23C 14/32* (2006.01)
- *B23B 27/14* (2006.01)

(52) U.S. Cl.
CPC ...... *C23C 14/0641* (2013.01); *C23C 14/0676* (2013.01); *C23C 14/083* (2013.01); *C23C 14/165* (2013.01); *C23C 14/325* (2013.01); *C23C 14/345* (2013.01); *C23C 14/3485* (2013.01); *B23B 27/14* (2013.01)

(58) Field of Classification Search
USPC .......................... 264/241, 460, 667, 668, 674
See application file for complete search history.

(56) References Cited

U.S. PATENT DOCUMENTS

| | | |
|---|---|---|
| 2008/0143260 A1 | 6/2008 | Tuymer et al. |
| 2008/0173536 A1 | 7/2008 | Ramm et al. |
| 2008/0193782 A1 | 8/2008 | Ramm et al. |
| 2013/0022420 A1* | 1/2013 | Waki ................ C23C 14/0664 407/115 |

FOREIGN PATENT DOCUMENTS

| | | |
|---|---|---|
| JP | 3877124 B2 | 2/2007 |
| JP | 2008-533310 A | 8/2008 |
| JP | 2009-167498 A | 7/2009 |
| JP | 2009-220260 A | 10/2009 |
| JP | 4846519 B2 | 12/2011 |
| JP | 2012-166321 A | 9/2012 |
| JP | 5487182 B2 | 5/2014 |

* cited by examiner

HARD COATING, HARD-COATED MEMBER, THEIR PRODUCTION METHODS, AND TARGET USED FOR PRODUCING HARD COATING

CROSS REFERENCE TO RELATED APPLICATIONS

This application is a National Stage of International Application No. PCT/JP2015/059456 filed Mar. 26, 2015 (claiming priority based on Japanese Patent Application No. 2014-114107 filed Jun. 2, 2014), the contents of which are incorporated herein by reference.

FIELD OF THE INVENTION

The present invention relates to a hard (AlTiW)NO coating having excellent oxidation resistance and wear resistance, a member having a hard (AlTiW)NO coating, their production methods, and a target used for producing a hard (AlTiW)NO coating.

BACKGROUND OF THE INVENTION

To provide long lives to tools for cutting works at a high feed or speed, dies used under severe molding conditions, etc., it is desired to form hard coatings having excellent oxidation resistance and wear resistance, and various proposals have been made. For example, JP 3877124 B discloses a hard AlTiCrNO coating having a laminate structure comprising a layer A comprising at least Al, Ti, Cr, N and O, the non-metal component being $N_w O_{100-w}$, wherein w is 70-99 atomic %, and having an oxygen content of 1-10 atomic %, and a layer B having an oxygen content of more than 10 atomic % and 30 atomic % or less. JP 3877124 B describes that the oxygen content in the AlTiCrNO coating is controlled by using a mixed gas of nitrogen and oxygen, with their mixing ratio adjusted. However, because the hard AlTiCrNO coating of JP 3877124 B does not have W—O bonds, it fails to satisfy the severe needs of recent higher performance for cutting tools, etc. In addition, because the method of JP 3877124 B uses an oxygen-containing atmosphere, even though a hard coating containing W in place of Cr were formed, oxygen in the atmosphere would predominantly react with Al to form Al oxide, and also react with Ti to form Ti oxide, resulting in an AlTiWNO coating having insufficient oxidation resistance and wear resistance.

JP 4846519 B discloses a target comprising Al, a component M (one or more elements selected from metals of Groups 4a, 5a and 6a, Si, B and S), and Al nitride, the amount of Al nitride contained being 5-30% by mol. JP 5487182 B discloses a target for sputtering, which is made of a Ti—Al alloy containing 1-30 atomic % of Al, Al forming a solid solution with Ti or an intermetallic compound with Ti, and an average oxygen content in the Ti—Al alloy being 1070 ppmw or less. However, because the targets described in JP 4846519 B and JP 5487182 B do not contain oxygen in an amount exceeding an inevitable impurity level, oxygen is introduced into the coating from the oxygen-containing atmosphere. Accordingly, oxygen-containing hard coatings obtained by using the targets of JP 4846519 B and JP 5487182 B do not have sufficient oxidation resistance and wear resistance, like the hard coating of JP 3877124 B.

JP 2009-220260 A discloses a coated tool obtained by forming a W-modified phase having a bcc structure and then a carbide phase on a WC-based cemented carbide substrate, and a hard nitride coating thereon. JP 2009-220260 A describes that the W-modified phase is formed by ion bombardment in an apparatus comprising an arc discharge evaporation source. Specifically, negative bias voltage P1 of −1000 V to −600 V is applied to a substrate at a surface temperature of 800-860° C., and the substrate is irradiated with metal ions (Ti ions) evaporated from the arc discharge evaporation source using a hydrogen-containing Ar gas of 0.01-2 Pa. However, because the hard nitride coating obtained by JP 2009-220260 A does not contain oxygen in an amount exceeding an inevitable impurity level, the resultant coating does not have targeted oxidation resistance and wear resistance. Of course, three targets C1 (for example, $Ti_{100}$), C2 (for example, $Al_{70}Cr_{30}$) and C3 (for example, $Ti_{75}Si_{25}$) used for producing the hard nitride coating of JP 2009-220260 A do not contain oxygen in an amount exceeding an inevitable impurity level.

JP 2008-533310 A discloses a method for forming a hard coating of $(Al_x Cr_{1-x})_y O_z$ in an oxygen-containing atmosphere, using an arc vapor deposition apparatus comprising a target electrode connected to a pulse power source. In the method of JP 2008-533310 A, however, oxygen is introduced from an atmosphere gas without using a target containing oxygen in an amount exceeding an inevitable impurity level, so that the resultant hard coating does not have targeted oxidation resistance and wear resistance.

OBJECT OF THE INVENTION

Accordingly, the first object of the present invention is to provide an (AlTiW)NO coating having better oxidation resistance and wear resistance as well as a longer life than those of conventional (AlTi)NO coatings.

The second object of the present invention is to provide a hard-coated member (cutting tool, die, etc.) having an (AlTiW)NO coating having better oxidation resistance and wear resistance as well as a longer life than those of conventional (AlTi)NO coatings.

The third object of the present invention is to provide methods for producing the (AlTiW)NO coating and the hard-coated member.

The fourth object of the present invention is to provide a target used for producing such (AlTiW)NO coating.

DISCLOSURE OF THE INVENTION

The arc-ion-plated hard coating of the present invention has a composition represented by $(Al_x Ti_y W_z)_a N_{(1-a-b)} O_b$, wherein x, y, z, a and b are numbers meeting by atomic ratio $0.6 \leq x \leq 0.8$, $0.05 \leq y \leq 0.38$, $0.02 \leq z \leq 0.2$, $x+y+z=1$, $0.2 \leq a \leq 0.8$, and $0.02 \leq b \leq 0.10$;

the hard coating having W—O bonds with substantially no Al—O bonds when identified by X-ray photoelectron spectroscopy, and only a NaCl-type structure in an X-ray diffraction pattern.

From the practical point of view, the hard coating preferably has a NaCl-type main structure and a wurtzite-type sub-structure, in an electron beam diffraction pattern.

The hard-coated member of the present invention comprises the above hard coating formed on a substrate. An intermediate layer indispensably comprising at least one metal element selected from elements in Groups 4a, 5a and 6a, Al and Si, and at least one element selected from B, O, C and N is preferably formed by physical vapor deposition between the substrate and the hard coating.

The oxidation resistance and wear resistance of the hard-coated member are further improved by forming an oxynitride layer having a composition represented by $(Al_hCr_i)_c(N_jO_k)_d$, wherein h=0.1-0.6, h+i=1, j=0.1-0.8, j+k=1, c=0.35-0.6, and c+d=1 by atomic ratio, on the hard coating, and further forming an oxide layer having a composition represented by $(Al_mCr_n)_2O_3$, wherein m=0.1-0.6, and m+n=1 by atomic ratio, by physical vapor deposition on the oxynitride layer.

The method of the present invention for producing the above hard coating on a substrate by arc ion plating comprises applying DC bias voltage or unipolar pulse bias voltage of −270 V to −20 V to the substrate, and supplying pulse arc current to an AlTi alloy target comprising Al nitride, Ti nitride, W nitride and W oxide, which is attached to an arc discharge evaporation source, to form the hard coating on the substrate kept at a temperature of 400-550° C. in a nitriding gas atmosphere; and the pulse arc current having a substantially rectangular waveform with the maximum arc current of 90-120 A and the minimum arc current of 50-90 A, the difference between the maximum arc current and the minimum arc current being 10 A or more, a frequency of 2-15 kHz, and a duty ratio of 40-70%.

The method of the present invention for producing a hard-coated member comprises applying DC bias voltage or unipolar pulse bias voltage of −270 V to −20 V to the substrate, and supplying pulse arc current to an AlTi alloy target comprising Al nitride, Ti nitride, W nitride and W oxide, which is attached to an arc discharge evaporation source, to form the above hard coating on the above substrate kept at a temperature of 400-550° C. in a nitriding gas atmosphere; and the pulse arc current having a substantially rectangular waveform with the maximum arc current of 90-120 A and the minimum arc current of 50-90 A, the difference between the maximum arc current and the minimum arc current being 10 A or more, a frequency of 2-15 kHz, and a duty ratio of 40-70%.

To form a hard coating having W—O bonds with substantially no Al—O bonds for excellent oxidation resistance and wear resistance, the target preferably has a composition represented by $(Al)_p(AlN)_q(Ti)_r(TiN)_s(WN)_t(WOx)_u$, wherein p, q, r, s, t and u are numbers meeting $0.59 \leq p \leq 0.8$, $0.01 \leq q \leq 0.1$, $0.04 \leq r \leq 0.35$, $0.03 \leq s \leq 0.15$, $0.01 \leq t \leq 0.20$, $0.01 \leq u \leq 0.1$, and p+q+r+s+t+u=1 by atomic ratio, and x is a number of 2-3 by atomic ratio.

When the substrate is made of WC-based cemented carbide, a thin modified layer having an Fcc structure is preferably formed on the substrate surface, before forming the hard coating. The first modified layer is formed by applying negative DC voltage of −850 V to −500 V to the substrate kept at a temperature of 400-700° C., and supplying arc current of 50-100 A to a target having a composition represented by $Ti_eO_{1-e}$, wherein e is a number expressing the atomic ratio of Ti meeting $0.7 \leq e \leq 0.95$, which is mounted to an arc discharge evaporation source, in an argon gas atmosphere having a flow rate of 30-150 sccm, thereby bombarding the substrate surface with ions generated from the target. The second modified layer is formed by applying negative DC voltage of −1000 V to −600 V to the substrate kept at a temperature of 450-750° C., and supplying arc current of 50-100 A to a target having a composition represented by $Ti_fBi_{1-f}$, wherein f is a number expressing the atomic ratio of Ti meeting $0.5 \leq f \leq 0.9$, which is mounted to the arc discharge evaporation source, in an argon gas atmosphere having a flow rate of 30-150 sccm, thereby bombarding the substrate surface with ions generated from the target. In both cases, because an (AlTiW)NO coating having the same crystal structure is formed directly on the modified layer, remarkably increased adhesion is achieved than when the (AlTiW)NO coating is formed directly on the WC-based cemented carbide without the modified layer.

The target used for producing the above hard coating is formed by sintered body having a composition represented by $(Al)_p(AlN)_q(Ti)_r(TiN)_s(WN)_t(WOx)_u$, wherein p, q, r, s, t and u are numbers meeting by atomic ratio $0.59 \leq p \leq 0.8$, $0.01 \leq q \leq 0.1$, $0.04 \leq r \leq 0.35$, $0.03 \leq s \leq 0.15$, $0.01 \leq t \leq 0.20$, $0.01 \leq u \leq 0.1$, and p+q+r+s+t+u=1, and x is a number of 2-3 by atomic ratio.

The sintered body for the target is preferably produced by hot-pressing a mixed powder comprising AlTi alloy powder, AlN powder, TiN powder, WN powder, and WOx powder (for example, $WO_3$ and/or $WO_2$ powder) in a vacuum atmosphere.

EFFECTS OF THE INVENTION

Because the hard coating of the present invention is formed by polycrystalline particles of Al-rich (AlTiW)NO having W—O bonds with substantially no Al—O bonds when observed by X-ray photoelectron spectroscopy, it has remarkably improved oxidation resistance and wear resistance than conventional (AlTi)NO coatings in which O is mainly bonded to Al. Accordingly, a member (cutting tool, die, etc.) having the hard coating of the present invention has a remarkably longer life than conventional ones. Because the method of the present invention for producing the above hard coating introduces W—O bonds into the hard coating from a target containing O in the form of WOx, without adding an oxygen gas to an atmosphere, the structure of the hard coating can be controlled stably and efficiently, resulting in extremely high usefulness.

Because a hard-coated member having the (AlTiW)NO coating of the present invention formed on a substrate of cemented carbide, ceramics such as cBN, sialon, etc., high-speed steel, or tool steel, has remarkably improved oxidation resistance and wear resistance than conventional AlTiNO-coated members, it is useful for cutting tools such as inserts, end mills, drills, etc., and various dies.

DESCRIPTION OF THE PREFERRED EMBODIMENTS

[1] Hard-Coated Member

Figure 1:
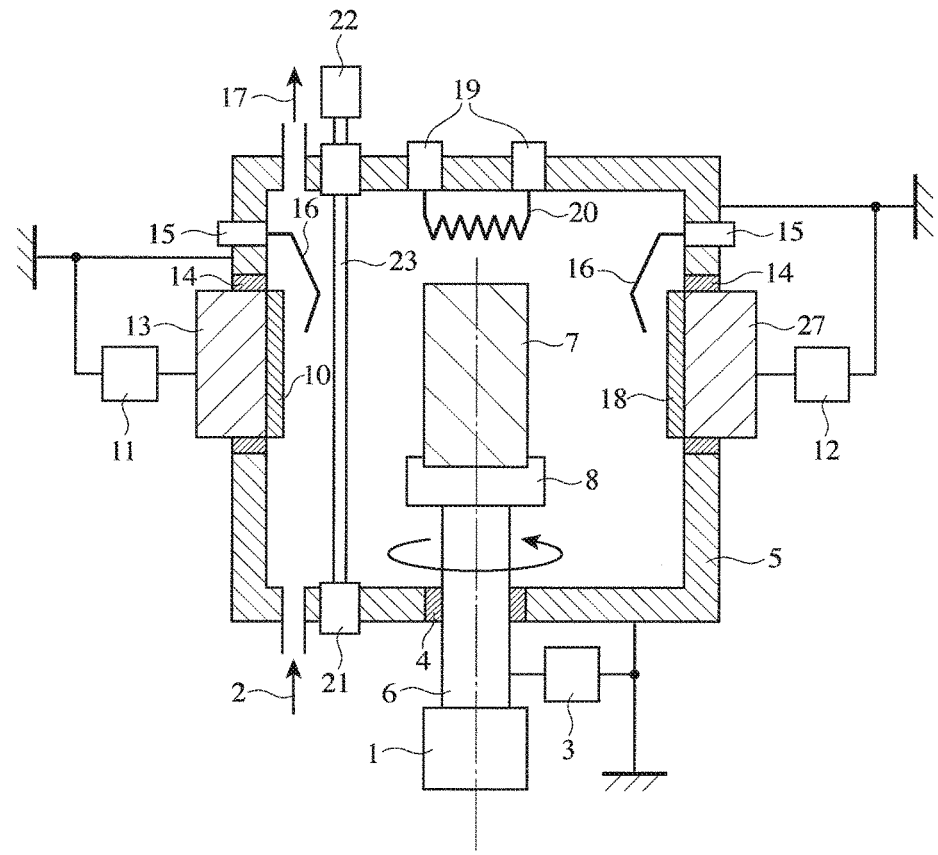
FIG. 1 is a front view showing an example of arc ion plating apparatuses usable for forming the hard coating of the present invention.

The hard-coated member of the present invention has a hard coating having a composition represented by $(Al_xTi_yW_z)_aN_{(1-a-b)}O_b$, wherein x, y, z, a and b are numbers meeting $0.6 \leq x \leq 0.8$, $0.05 \leq y \leq 0.38$, $0.02 \leq z \leq 0.2$, $x+y+z=1$, $0.2 \leq a \leq 0.8$, and $0.02 \leq b \leq 0.10$ by atomic ratio, which is formed on a substrate by an arc ion plating method (AI method). The hard coating has W—O bonds with substantially no Al—O bonds in an X-ray photoelectron spectrum, and only a NaCl-type structure in an X-ray diffraction pattern.

(A) Substrate

The substrate should be a material having excellent heat resistance, to which physical vapor deposition can be applied. Materials for the substrate include, for example, cemented carbide, cermet, high-speed steel, tool steel, or ceramics such as sintered boron nitride (cBN) comprising cubic boron nitride as a main component. From the aspect of strength, hardness, wear resistance, toughness and thermal stability, etc., WC-based cemented carbide or ceramics are preferable. WC-based cemented carbide comprises tungsten carbide (WC) particles, and a binder phase of Co or a Co-based alloy. The amount of the binder phase is preferably 1-13.5% by mass, more preferably 3-13% by mass. Less than 1% by mass of the binder phase provides the substrate with insufficient toughness, while more than 13.5% by mass of the binder phase provides the substrate with insufficient hardness (wear resistance). Any of unground surfaces, ground surfaces and cutting edge surfaces of the sintered WC-based cemented carbide may be provided with the (AlTiW)NO coating of the present invention.

(B) Modified Layer of WC-Based Cemented Carbide Substrate

When the substrate is made of WC-based cemented carbide, the substrate is preferably irradiated with ions generated from the above TiO or TiB target, to form a modified layer of an Fcc structure having an average thickness of 1-10 nm. Though WC as a main component in the WC-based cemented carbide has a hexagonal structure, the modified layer has an Fcc structure like the (AlTiW)NO coating, resulting in 30% or more, preferably 50% or more, more preferably 70% or more, of continuous crystal lattice fringes in their boundaries (interfaces), so that the (AlTiW)NO coating is strongly adhered to the WC-based cemented carbide substrate via the modified layer.

A modified layer obtained by ion bombardment with a TiO target comprises $W_3O$ having an Fcc structure, which is obtained by slightly containing O in WC particles mainly constituting the WC-based cemented carbide substrate, and/or CoO having an Fcc structure, which is obtained by slightly containing O in Co. Because the modified layer is formed as a high-density, thin layer, it unlikely acts as a starting site of breakage. A modified layer obtained by ion bombardment with a TiB target also has an Fcc structure, and unlikely acts as a starting site of breakage because it is formed as a high-density, thin layer. Improvement in adhesion of the hard coating to the substrate is insufficient when the average thickness of the modified layer is less than 1 nm, while it is rather deteriorated when the average thickness is more than 10 nm.

(C) (AlTiW)NO Coating (1) Composition

The (AlTiW)NO coating of the present invention formed on the substrate by an AI method is made of oxynitride comprising Al, Ti and W as indispensable elements. The composition of the (AlTiW)NO coating is represented by the general formula: $(Al_xTi_yW_z)_aN_{(1-a-b)}O_b$ (atomic ratio), wherein x, y, z, a and b are numbers meeting $0.6 \leq x \leq 0.8$, $0.05 \leq y \leq 0.38$, $0.02 \leq z \leq 0.2$, $x+y+z=1$, $0.2 \leq a \leq 0.8$, and $0.02 \leq b \leq 0.10$. The (AlTiW)NO coating of the present invention contains W—O bonds with substantially no Al—O bonds when identified by X-ray photoelectron spectroscopy, and has only a NaCl-type structure in an X-ray diffraction pattern. The term "with substantially no Al—O bonds" used herein means that there is no a peak of Al—O bonds exceeding an inevitable impurity level in an X-ray photoelectron spectrum of the (AlTiW)NO coating.

With the total amount (x+y+z) of Al, Ti and W being 1, the Al ratio x of less than 0.6 provides the hard coating with insufficient oxidation resistance and wear resistance, while the Al ratio x exceeding 0.8 turns a wurtzite-type structure to a main structure, providing the hard coating with deteriorated wear resistance. The Al ratio x is preferably in a range of 0.6-0.75.

With the total amount (x+y+z) of Al, Ti and W being 1, the Ti ratio y of less than 0.05 provides extremely low adhesion of the (AlTiW)NO coating to the substrate, while the Ti ratio y exceeding 0.38 reduces the Al content in the hard coating, resulting in deteriorated oxidation resistance and wear resistance. The Ti ratio y is preferably in a range of 0.1-0.3.

With the total amount (x+y+z) of Al, Ti and W being 1, the W ratio z of less than 0.02 provides substantially no W—O bonds in the X-ray photoelectron spectrum, deteriorating the oxidation resistance and wear resistance of the hard coating, while the W ratio z exceeding 0.2 makes the (AlTiW)NO coating amorphous, resulting in deteriorated wear resistance. The W ratio z is preferably in a range of 0.05-0.15.

With the total amount of metal components (AlTiW), nitrogen and oxygen in the (AlTiW)NO coating being 1, when the ratio a of the metal components (AlTiW) is less than 0.2, impurities are easily contained in grain boundaries of polycrystalline (AlTiW)NO. The impurities are derived from those remaining in the film-forming apparatus. In such a case, the (AlTiW)NO coating has such low bonding strength that it is easily broken by external impact. On the other hand, when exceeding 0.8, the ratio a of the metal components (AlTiW) is too much, resulting in large crystal strain, and thus low adhesion to the substrate, so that the (AlTiW)NO coating easily peels from the substrate. The preferred ratio a of the metal components (AlTiW) is in a range of 0.25-0.75.

When the oxygen content b in the (AlTiW)NO coating is less than 0.02 or more than 0.10, the (AlTiW)NO coating has low oxidation resistance and wear resistance. The preferred oxygen content b is in a range of 0.03-0.10.

The (AlTiW)NO coating of the present invention may contain C and/or B. In this case, the total amount of C and B is preferably 30 atomic % or less, more preferably 10 atomic % or less, of the amount of NO, to have high wear resistance. When C and/or B are contained, the (AlTiW)NO coating is oxynitrocarbide, oxynitroboride, or oxynitrocarboboride.

Taking an (AlTi)N-coated cutting tool for example, a mechanism that the (AlTiW)NO coating of the present invention has higher oxidation resistance and wear resistance than conventional ones is considered as follows. In a conventional (AlTi)N-coated cutting tool, a large amount of oxygen is taken into the coating from the surface during cutting, predominantly oxidizing Al near the coating surface, thereby forming an Al oxide layer. During this process, Ti is also combined with oxygen to form a weak Ti oxide layer having an extremely low density under the Al oxide layer. This is due to the fact that the formation free energy of Al oxide is lower than that of Ti oxide. Acting as a starting site of breakage in the coating during cutting, such a weak Ti oxide layer is easily broken and peels together with the Al oxide layer. The formation of the Al oxide layer and the peeling of the coating starting from the Ti oxide layer are thus repeated, resulting in the breakage of the coating. It has been found that this occurs not only in (AlTiW)N coatings simply containing W, but also in (AlTiW)NO coatings taking oxygen from the atmosphere by conventional methods. As described later, in order that the (AlTiW)NO coating has excellent oxidation resistance and wear resistance, simply containing a predetermined amount of O is not satisfactory, but O should be bonded to W with substantially no bonding to Al.

W exists in the (AlTiW)NO coating of the present invention as W—O bonds and W—N bonds. In the (AlTiW)NO coating meeting this condition, dense oxides of Al and W are presumably formed by heat generated by cutting, due to low formation free energy. Because the (AlTiW)NO coating having W—O bonds is extremely denser than conventional (AlTi)N coatings and (AlTiW)NO coatings formed in an oxygen-containing atmosphere, the diffusion of oxygen is suppressed. Because independently existing W—O bonds are predominantly reacted with Al during cutting, there remains no oxygen reacting with Ti, so that weak Ti oxide is not formed, enabling to keep excellent oxidation resistance and wear resistance.

(2) Thickness

The average thickness of the (AlTiW)NO coating of the present invention is preferably 0.5-15 μm, more preferably 1-12 μm. With the thickness in this range, the (AlTiW)NO coating is prevented from peeling from the substrate, exhibiting excellent oxidation resistance and wear resistance. The average thickness of less than 0.5 μm fails to make the (AlTiW)NO coating exhibit sufficient effects, and the average thickness of more than 15 μm results in excessive residual stress, making the (AlTiW)NO coating easily peelable from the substrate. Here, the "thickness" of the (AlTiW) NO coating, which is not flat, means average thickness.

(3) Crystal Structure

In an X-ray diffraction pattern, the (AlTiW)NO coating of the present invention has only a NaCl-type structure. In a selected-field diffraction pattern by a transmission electron microscope, the (AlTiW)NO coating of the present invention has a NaCl-type structure as a main structure, and may have other structures (wurtzite-type structure, etc.) as a sub-structure. A practically useful (AlTiW)NO coating preferably has a NaCl-type structure as a main structure, and a wurtzite-type structure as a sub-structure.

(D) Hard Laminate Coating

The (AlTiW)NO coating of the present invention may be an alternate laminate of two or more (AlTiW)NO coatings having different compositions, in a composition range represented by $(Al_xTi_yW_z)_aN_{(1-a-b)}O_b$, wherein x, y, z, a and b are numbers meeting by atomic ratio $0.6 \leq x \leq 0.8$, $0.05 \leq y \leq 0.38$, $0.02 \leq z \leq 0.2$, $x+y+z=1$, $0.2 \leq a \leq 0.8$, and $0.02 \leq b \leq 0.10$). Such laminate structure further increases wear resistance and oxidation resistance.

(E) Intermediate Layer

An intermediate layer indispensably comprising at least one element selected from the group consisting of elements in Groups 4a, 5a and 6a, Al and Si, and at least one element selected from the group consisting of B, O, C and N may be formed between the substrate and the (AlTiW)NO coating, by physical vapor deposition. The intermediate layer is preferably at least one selected from the group consisting of TiN; and (TiAl)N, (TiAl)NC, (TiAl)NCO, (TiAlCr)N, (TiAlCr)NC, (TiAlCr)NCO, (TiAlNb)N, (TiAlNb)NC, (TiAlNb)NCO, (TiAlW)N and (TiAlW)NC each having a NaCl-type structure as a main structure; and (TiSi)N, (TiB)N, TiCN, $Al_2O_3$, $Cr_2O_3$, $(AlCr)_2O_3$, (AlCr)N, (AlCr)NC, and (AlCr)NCO. The intermediate layer may be a single layer or a laminate.

[2] Forming Apparatus

An AI apparatus can be used for the formation of an (AlTiOW)NO coating, and an AI apparatus or other physical vapor deposition apparatuses (sputtering apparatus, etc.) can be used for the formation of a modified layer and an intermediate layer. As shown in FIG. 1, for example, the AI apparatus comprises arc discharge evaporation sources 13, 27 each attached to a vacuum chamber 5 via an insulator 14, targets 10, 18 each mounted to each arc discharge evaporation source 13, 27, arc discharge power sources 11, 12 each connected to each arc discharge evaporation source 13, 27, a column 6 rotatably supported by the vacuum chamber 5 via a bearing 4, a holder 8 supported by the column 6 for holding a substrate 7, a driving means 1 for rotating the column 6, and a bias power source 3 applying bias voltage to the substrate 7. The vacuum chamber 5 has a gas inlet 2 and a gas outlet 17. The arc ignition mechanisms 16, 16 are mounted to the vacuum chamber 5 via the arc ignition mechanism bearings 15, 15. An electrode 20 is mounted to the vacuum chamber 5 via insulators 19, 19. A shield plate 23 is mounted to the vacuum chamber 5 via shield plate bearings 21 between the target 10 and the substrate 7. Though not depicted in FIG. 1, the shield plate 23 is vertically or laterally taken out of the vacuum chamber 5, for example, by a shield plate driving means 22, to carry out the formation of the (AlTiW)NO coating of the present invention.

(A) Target for Forming (AlTiW)NO Coating

A target for forming the (AlTiW)NO coating of the present invention has a composition represented by $(Al)_p(AlN)_q(Ti)_r(TiN)_s(WN)_t(WOx)_u$, wherein p, q, r, s, t and u are numbers meeting by atomic ratio $0.59 \leq p \leq 0.8$, $0.01 \leq q \leq 0.1$, $0.04 \leq r \leq 0.35$, $0.03 \leq s \leq 0.15$, $0.01 \leq t \leq 0.20$, $0.01 \leq u \leq 0.1$, and $p+q+r+s+t+u=1$, and x is a number of 2-3 by atomic ratio, except for inevitable impurities. Here, (AlN), (TiN) and (WN) mean $(Al_1N_1)$, $(Ti_1N_1)$ and $(W_1N_1)$ by atomic ratio, and (WOx) means $(W_1Ox)$ by atomic ratio. WOx is a main constituent of tungsten oxide, mostly $WO_3$ and/or $WO_2$, though it may contain at least one of $W_2O_5$, $W_4O_{11}$, $W_1O_1$, $W_2O_3$, $W_4O_3$, $W_5O_9$, $W_3O_8$ and $W_5O_{14}$. Without p, q, r, s, t and u within the above ranges, the (AlTiW)NO coating of the present invention cannot be obtained. In addition to metal Al and metal Ti, (a) Al nitride, Ti nitride and W nitride in the above amounts are contained in the target, so that the amount of droplets generated during arc discharge can be drastically reduced, and that the amount of oxygen emitted from the target can be suppressed, and (b) with W oxide in the above amount contained in the target, W—O bonds can be independently introduced into the (AlTiW)NO coating. The numbers of p, q, r, s, t and u preferably meet $0.59 \leq p \leq 0.75$, $0.01 \leq q \leq 0.10$, $0.05 \ r \ 0.25$, $0.05 \leq s \ 0.15$, $0.01 \leq t \leq 0.15$, $0.01 \leq u \leq 0.10$, and $p+q+r+s+t+u=1$ by atomic ratio.

The suppression of droplets appears to be due to a function that when the above target-constituting elements are evaporated by arc discharge, nitrogen derived from nitrides of the constituent elements (Al, Ti and W) are ionized near the target surface to increase an arc-spot-moving speed. With nitrides of constituent elements (Al, Ti and W) existing very near single phases of Al on the evaporating surface, the area of single phases of Al having an apparently low melting point decreases, avoiding the concentration of arc discharge, so that the amount of droplets can be reduced. This is due to the fact that nitrides of constituent elements (Al, Ti and W) have higher melting points than that of the single phases of Al. As a result, huge droplets are suppressed. Because the growth of polycrystalline particles is not hindered in a (AlTiW)NO coating with reduced droplets, a high-density (AlTiW)NO coating having higher strength than conventional ones is obtained.

A main reason why the oxygen content can be reduced when forming the above target and (AlTiW)NO coating is that with part of Al and Ti in the target turned to chemically stable nitrides, the oxidation of the starting material powder for the target is suppressed by heat generated in the mixing and hot-pressing steps, etc. of the starting material powder. With oxidation suppressed, the oxygen content of the target is drastically lowered, resulting in a drastically reduced amount of oxygen emitted from the target during arc discharge. As a result, the unintended inclusion of oxygen in the (AlTiW)NO coating is suppressed, resulting in remarkably decreased oxidation of Ti. Because the (AlTiW)NO coating of the present invention suffers fewer droplets than in conventional ones by such oxidation-suppressing effect during formation, the growth of polycrystalline (AlTiW)NO particles is not hindered. Further, with reduced segregation of crystal grain boundaries, it has a sound structure having grown polycrystalline particles.

WOx in the above target is necessary for adding W—O bonds to the coating. WOx in the target is turned to W ions and O ions by arc spot, and instantaneously reacted with each other to form W—O bonds, reaching the (AlTiW)NO coating. Because WOx has electric conductivity, it can be stably arc-discharged.

The target for the (AlTiW)NO coating can be produced as follows. To carry out a powder metallurgy method, AlTi alloy powder, AlN powder, TiN powder, WN powder, and WOx powder (for example, $WO_3$ powder and/or $WO_2$ powder) are charged into a closed ball mill container, and mixed for several hours (for example, 5 hours) in an argon gas atmosphere. To obtain a sintered body having a high density, the average diameter of each powder is preferably 0.01-500 μm, more preferably 0.1-100 μm. The average diameter of each powder is determined by observation by a scanning electron microscope (SEM). To avoid uneven composition distribution and the inclusion of impurities, alumina balls having purity of 99.999% or more are preferably used for media. The mixed powder is charged into a graphite die of a vacuum hot-pressing apparatus for sintering. To prevent a trace amount of oxygen contained in the atmosphere in the sintering apparatus from entering the target, pressing and sintering are carried out preferably after reaching a vacuum degree of $1 \times 10^{-3}$ Pa to $10 \times 10^{-3}$ Pa (for example, $7 \times 10^{-3}$ Pa) in the sintering apparatus. A pressing load is preferably 100-200 MPa (for example, 170 MPa). To avoid the melting of Al during sintering, sintering is carried out preferably at a temperature of 520-580° C. (for example, 550° C.) for several hours (for example, 2 hours). The sintered target is machined to a shape suitable for the AI apparatus, to obtain a target for forming the (AlTiW)NO coating.

(B) TiO Target for Forming Modified Layer

The TiO target forming a modified layer has a composition represented by $Ti_eO_{1-e}$, wherein e is a number representing an atomic ratio of Ti, which meets $0.7 \leq e \leq 0.95$, except for inevitable impurities. When the atomic ratio e of Ti is less than 0.7, oxygen is excessive, failing to obtain a modified layer having an Fcc structure. On the other hand, when the atomic ratio e of Ti is more than 0.95, oxygen is insufficient, also failing to obtain a modified layer having an Fcc structure. The preferred atomic ratio e of Ti is in a range of 0.8-0.9.

The TiO target forming a modified layer is preferably produced by a hot-pressing method. To take oxygen intentionally in the target in the production process, for example, metal Ti powder is charged into a die of WC-based cemented carbide in the hot-pressing apparatus, and the die is evacuated to vacuum, to carry out sintering in an Ar gas atmosphere containing 1-20% by volume (for example, 5% by volume) of an oxygen gas for several hours (for example, 2 hours). The resultant sintered body is machined to a shape suitable for the AI apparatus, to obtain a TiO target for forming the modified layer.

(C) TiB Target for Forming Modified Layer

The TiB target for forming a modified layer has a composition represented by $Ti_fB_{1-f}$, wherein f is a number meeting $0.5 \leq f \leq 0.9$, which represents the atomic ratio of Ti, except for inevitable impurities. When the atomic ratio f of Ti is less than 0.5, a modified layer having an Fcc structure cannot be obtained. On the other hand, when the atomic ratio f of Ti is more than 0.9, a decarburized phase is formed, failing to obtain a modified layer having an Fcc structure. The preferred atomic ratio f of Ti is 0.7-0.9.

The TiB target for forming the modified layer is also preferably produced by a hot-pressing method. To avoid the intrusion of oxygen as much as possible in the production step, for example, TiB powder is charged into a die of WC-based cemented carbide in the hot-pressing apparatus, to carry out sintering in an evacuated atmosphere of $1 \times 10^{-3}$ Pa to $10 \times 10^{-3}$ Pa (for example, $7 \times 10^{-3}$ Pa) for several hours (for example, 2 hours). The resultant sintered body is machined to a shape suitable for the AI apparatus, to obtain a TiB target for forming the modified layer.

(D) Arc Discharge Evaporation Source and Arc Discharge Power Source

As shown in FIG. 1, each of the arc discharge evaporation sources 13, 27 comprises a target 10 of TiO or TiB, a cathode material, for forming the modified layer, and a target (for example, Al—AlN—Ti—TiN—WN—WO$_3$ alloy) 18 for forming the (AlTiW)NO coating. Supplied from the arc discharge power sources 11, 12 under the following conditions are DC arc current to the target 10, and pulse arc current to the target 18. Though not depicted, each arc discharge evaporation source 13, 27 is provided with a magnetic-field-generating means comprising an electromagnet and/or a permanent magnet and a yoke, to generate a magnetic field distribution having a gap magnetic flux density of several tens of G (for example, 10-50 G) near the substrate 7 on which the (AlTiW)NO coating is formed.

Because the target (for example, Al—AlN—Ti—TiN—W—WO$_3$ alloy) for forming the (AlTiW)NO coating of the present invention contains a smaller amount of low-melting-point metal Al than in conventional AlTi alloy targets, arc spot likely resides on Al during the formation of the (AlTiW) NO coating. The residing arc spot generates large molten portions, whose liquid drops are likely attached to the substrate surface. The liquid drops are called "droplets," roughening the (AlTiW)NO coating surface. The droplets divide the growth of polycrystalline (AlTiW)NO particles, and act as starting sites of coating breakage, so that the desired (AlTiW)NO coating cannot be obtained.

As a result of investigation for solving this problem, it has been found that pulse arc current should be supplied to a target for forming the (AlTiW)NO coating attached to the arc discharge evaporation source under predetermined conditions, to form the (AlTiW)NO coating of the present invention with decreased droplets, while suppressing the formation of oxides on the target for forming the (AlTiW) NO coating.

(E) Bias Power Source

As shown in FIG. 1, DC voltage or pulse bias voltage is applied from the bias power source 3 to the substrate 7.

[3] Forming Conditions

The (AlTiW)NO coating of the present invention having W—O bonds with substantially no Al—O bonds can be produced by supplying pulse arc current to the above-described target for forming the (AlTiW)NO coating under the predetermined conditions in an AI method. The production conditions of the (AlTiW)NO coating of the present invention will be explained in detail below for each step.

(A) Cleaning Step of Substrate

The substrate 7 set on the holder 8 in the AI apparatus shown in FIG. 1 is heated to a temperature of 250-650° C. by a heater (not shown), while keeping vacuum of $1\text{-}5\times10^{-2}$ Pa (for example, $1.5\times10^{-2}$ Pa) in the vacuum chamber 5. Though depicted in a columnar shape in FIG. 1, the substrate 7 may be in various forms such as a solid-type end mill or an insert, etc. Thereafter, an argon gas is introduced into the vacuum chamber 5 to have an argon gas atmosphere of 0.5-10 Pa (for example, 2 Pa). In this state, the substrate 7 is cleaned by argon gas bombardment, with DC bias voltage or pulse bias voltage of −250 V to −150 V applied from the bias power source 3 to the substrate 7.

The substrate temperature of lower than 250° C. fails to provide the etching effect of an argon gas, while the substrate temperature of higher than 650° C. saturates the etching effect of an argon gas, resulting in lower industrial productivity. The substrate temperature is measured by a thermocouple embedded in the substrate (the same is true below). With the argon gas pressure outside a range of 0.5-10 Pa in the vacuum chamber 5, the argon gas bombardment is unstable. When DC bias voltage or pulse bias voltage is less than −250 V, arcing occurs on the substrate. When it is more than −150 V, a sufficient cleaning effect by bombardment etching cannot be obtained.

(B) Modified-Layer-Forming Step

Ion bombardment to the WC-based cemented carbide substrate 7 using a TiO target to form a modified layer on the substrate 7 is conducted in an argon gas atmosphere having a flow rate of 30-150 sccm, after the substrate 7 is cleaned. Arc current (DC current) of 50-100 A is supplied from the arc discharge power source 11 to the TiO target attached to the arc discharge evaporation source 13. With the substrate 7 heated to a temperature of 400-700° C., DC bias voltage of −850 V to −500 V is applied from the bias power source 3 to the substrate 7. By ion bombardment using the TiO target, the WC-based cemented carbide substrate 7 is irradiated with Ti ions and O ions.

When the temperature of the substrate 7 is lower than 400° C., a modified layer having an Fcc structure cannot be formed. On the other hand, when the temperature of the substrate 7 is higher than 700° C., Ti oxide having a rutile structure, etc. is precipitated, providing the hard coating with lower adhesion. When the flow rate of an argon gas is less than 30 sccm in the vacuum chamber 5, Ti ions, etc. impinging on the substrate 7 have too much energy, forming a decarburized layer on a surface of the substrate 7, thereby deteriorating the adhesion of the hard coating. On the other hand, when the flow rate of an argon gas is more than 150 sccm, Ti ions, etc. have too low energy, failing to form the modified layer.

The arc current of less than 50 A provides unstable arc discharge, and the arc current of more than 100 A forms a lot of droplets on the substrate 7, deteriorating the adhesion of the hard coating. The DC bias voltage of less than −850 V provides Ti ions, etc. with too much energy, forming a decarburized layer on a surface of the substrate 7, and the DC bias voltage of more than −500 V fails to form a modified layer on the substrate.

Ion bombardment to the WC-based cemented carbide substrate 7 using a modified-layer-forming TiB target differs from ion bombardment using a modified-layer-forming TiO target, in that the substrate 7 is heated to a temperature of 450-750° C., and that DC bias voltage of −1000 V to −600 V is applied from the bias power source 3 to the substrate 7. By ion bombardment using the TiB target, the WC-based cemented carbide substrate is irradiated with Ti ions and B ions. With the temperature of the substrate 7 outside a range of 450-750° C., a modified layer having an Fcc structure is not formed. The DC bias voltage of less than −1000 V forms a decarburized layer on a surface of the substrate 7, and the DC bias voltage of more than −600 V provides ion bombardment with substantially no effect.

(C) Step of Forming (AlTi W)NO Coating

The (AlTiW)NO coating is formed on the substrate 7 (on the modified layer when formed). Pulse arc current is supplied from the arc discharge power source 12 to the target 18 attached to the arc discharge evaporation source 27 in a nitriding gas under the conditions described below. Simultaneously, DC bias voltage or pulse bias voltage is applied from the bias power source 3 to the substrate 7 controlled at a predetermined temperature.

(1) Substrate Temperature

When the (AlTiW)NO coating is formed, the substrate temperature should be 400-550° C. When the substrate temperature is lower than 400° C., (AlTiW)NO is not fully crystallized, so that the resultant (AlTiW)NO coating has insufficient wear resistance, and is peelable due to increased residual stress. On the other hand, when the substrate temperature is higher than 550° C., an rock salt (NaCl)-type structure is unstable, so that the (AlTiW)NO coating has low wear resistance and oxidation resistance. The substrate temperature is preferably 400-540° C.

(2) Type and Pressure of Nitriding Gas

A nitriding gas for forming the (AlTiW)NO coating on the substrate 7 may be a nitrogen gas, a mixed gas of ammonia and hydrogen, etc. The pressure of the nitriding gas is preferably 2-6 Pa. When the nitriding gas pressure is less than 2 Pa, nitride is not formed insufficient. When the nitriding gas pressure is more than 6 Pa, the effect of adding a nitriding gas is saturated.

(3) Bias Voltage Applied to Substrate

To form the (AlTiW)NO coating, DC bias voltage or unipolar pulse bias voltage is applied to the substrate. The DC bias voltage is negative in a range of −270 V to −20 V. When the DC bias voltage is less than −270 V, arcing occurs on the substrate, or a reverse sputtering phenomenon occurs, failing to form W—O bonds. On the other hand, when the DC bias voltage is more than −20 V, the effect of applying bias voltage is not obtained, failing to form W—O bonds. The preferred DC bias voltage range is −250 V to −50 V.

When unipolar pulse bias voltage is used, negative bias voltage (negative peak value except for a rapid uprising portion from zero to the negative side) is −270 V to −20 V. Outside this range, the (AlTiW)NO coating of the present invention cannot be obtained. The preferred negative bias voltage range is −250 V to −50 V. The frequency of the unipolar pulse bias voltage is preferably 20-50 kHz, more preferably 30-40 kHz.

(4) Pulse Arc Current

Figure 2:
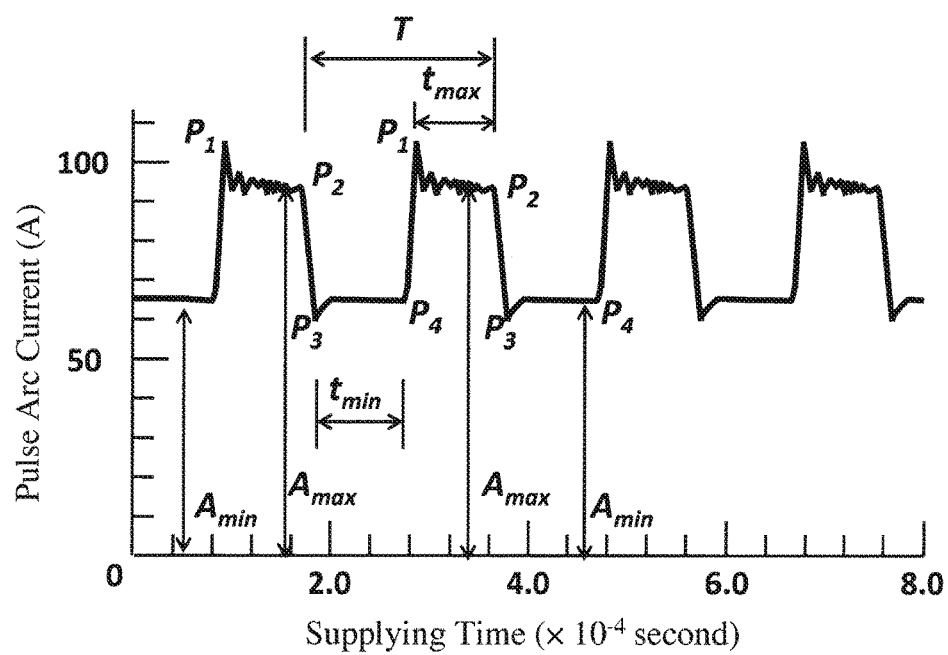
FIG. 2 is a graph showing an example of pulse arc current waveforms applied to an arc discharge evaporation source during forming the hard coating of the present invention.

To suppress the generation of droplets and the formation of oxides on the target surface while stabilizing arc discharge during forming the (AlTiW)NO coating, pulse arc current is supplied to the target 18 for forming the (AlTiW) NO coating. As schematically shown in FIG. 2 (waveform of pulse arc current in Example 1), for example, pulse arc current has a pulse waveform having at least two substantially rectangular steps. In a period T, $t_{min}$, is a current-supplying time in a minimum ($A_{min}$)-side stable region of the pulse arc current, and $t_{max}$ is a current-supplying time in a maximum ($A_{max}$)-side stable region of the pulse arc current.

As shown in FIG. 2, in one pulse (period T) of the pulse arc current waveform, the maximum ($A_{max}$)-side stable region is between an $A_{max}$-side start point $P_1$ and an $A_{max}$-side end point $P_2$ excluding a steep rising portion (from an $A_{min}$-side end point $P_4$ to an $A_{max}$-side start point $P_1$), with the current-supplying time $t_{max}$ being from the point $P_1$ to the point $P_2$. Because the pulse current has a gradually decreasing waveform in a region from the point $P_1$ to the point $P_2$ on the $A_{max}$ side, a pulse arc current waveform value of 95 A at the point $P_2$ was regarded as $A_{max}$. The minimum ($A_{min}$)-side stable region is between an $A_{min}$-side start point $P_3$ and an $A_{min}$-side end point $P_4$ excluding a steep falling portion (from the $A_{max}$-side end point $P_2$ to the $A_{min}$-side start point $P_3$), with the current-supplying time $t_{min}$ being from the point $P_3$ to the point $P_4$. Because the pulse current has a gradually decreasing waveform in a region from the point $P_3$ to the point $P_4$ on the $A_{min}$ side, a pulse arc current waveform value of 65 A at the point $P_4$ was regarded as $A_{min}$.

To suppress the generation of droplets and the formation of oxides on the target surface while stabilizing arc discharge during forming the (AlTiW)NO coating, $A_{min}$ is 50-90 A, preferably 50-80 A. $A_{min}$ of less than 50 A does not cause arc discharge, failing to form the coating, and $A_{min}$, of more than 90 A increases droplets, deteriorating the oxidation resistance of the coating. $A_{max}$ is 90-120 A, preferably 90-110 A. When $A_{max}$ is outside the range of 90-120 A, droplets similarly increase, deteriorating the oxidation resistance of the coating.

The difference $\Delta A$ of $A_{max}$ and $A_{min}$ is 10 A or more, preferably 10-60 A, more preferably 20-55 A. When $\Delta A$ is less than 10 A, droplets increase, deteriorating the oxidation resistance of the coating.

The percentage of $t_{max}$ to $t_{min}$ in the pulse arc current is expressed by a duty ratio D defined by the following formula:

$$D=[t_{min}/(t_{min}+t_{max})]\times 100\%,$$

wherein $t_{min}$ is a current-supplying time in a stable region of the minimum pulse arc current $A_{min}$, and $t_{max}$ is a current-supplying time in a stable region of the maximum pulse arc current $A_{max}$.

The duty ratio D is 40-70%, preferably 45-65%. When the duty ratio D is outside the range of 40-70%, arc discharge is unstable, so that the (AlTiW)NO coating has an unstable NaCl-type structure, or that droplets increase. It should be noted that the waveform of pulse arc current is not restricted to two steps shown in FIG. 2, but may have 3 or more steps (for example, 3-10 steps) as long as the waveform has at least stable regions of $A_{max}$ and $A_{min}$.

The frequency of pulse arc current is 2-15 kHz, preferably 2-14 kHz. With the frequency of pulse arc current outside the range of 2-15 kHz, arc discharge is unstable, or large amounts of oxides are formed on the target for forming the (AlTiW)NO coating.

With pulse arc current supplied under conditions within the above optimum ranges, stable arc discharge is obtained. Because the residing of arc spot on Al and the formation of oxides on the target for forming the (AlTiW)NO coating are suppressed, an AlTiWO alloy is uniformly melted and evaporated, so that a (AlTiW)NO coating having a stable composition is formed on the substrate.

Using the target containing WOx for forming the (AlTiW) NO coating in an atmosphere gas containing no oxygen, the (AlTiW)NO coating of the present invention having W—O bonds with substantially no Al oxide and Ti oxide is formed. In the formation step of the (AlTiW)NO coating, WOx is evaporated and instantaneously ionized by arc spot to form W ions and O ions, which are instantaneously reacted. It is thus considered that W—O bonds are formed in the coating while suppressing the formation of Al oxide and Ti oxide. On the other hand, when an (AlTiW)NO coating is formed in an oxygen-containing atmosphere, Al and Ti much more easily oxidizable than W are predominantly reacted with oxygen in the atmosphere, forming large amounts of Al oxide and Ti oxide in the coating, without forming W—O bonds. An (AlTiW)NO coating containing Al oxide and Ti oxide does not have sufficient oxidation resistance and wear resistance.

The present invention will be explained in detail by Examples below without intention of restriction. In Examples and Comparative Examples below, the target compositions are values measured by chemical analysis unless otherwise mentioned. Though inserts were used as substrates for hard coatings in Examples, the present invention is of course not restricted thereto, but other cutting tools than inserts (end mills, drills, etc.), dies, etc. may be used.

Example 1

(1) Cleaning of Substrate

Figure 14:
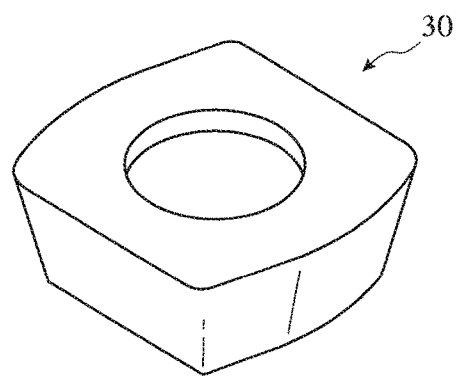
FIG. 14 is a perspective view showing an example of insert substrates constituting the hard-coated member of the present invention.

High-feed milling insert substrates (EDNW15T4TN-15 available from Hitachi Tool Engineering, Ltd. having the shape shown in FIG. 14), and property-measuring insert substrates (SNMN120408 available from Hitachi Tool Engineering, Ltd.), which were made of WC-based cemented carbide having a composition comprising 6.0% by mass of Co, the balance being WC and inevitable impurities, were set on a holder 8 in the AI apparatus shown in FIG. 1, and heated to 600° C. by a heater (not shown) simultaneously with evacuation to vacuum. Thereafter, with an argon gas in a flow rate of 500 sccm introduced into a vacuum chamber 5 to adjust the pressure to 2.0 Pa, and with negative DC bias voltage of −200 V applied to each substrate, each substrate was cleaned by etching by bombardment with argon ions. The term "sccm" means a flow rate (cc/minutes) at 1 atm and 25° C.

(2) Formation of Modified Layer Using TiO Target

With the substrate temperature kept at 600° C., and with an argon gas supplied at a flow rate of 50 sccm, a TiO target 10 having a composition represented by $Ti_{0.85}O_{0.15}$ by atomic ratio was attached to an arc discharge evaporation source 13 connected to an arc discharge power source 11. With negative DC voltage of −700 V applied from the bias power source 3 to each substrate, and with DC arc current of 80 A supplied from the arc discharge power source 11 to the target 10, a modified layer was formed on each substrate.

(3) Formation of (AlTiW)NO Coating

With the substrate temperature set at 450° C., a nitrogen gas of 800 sccm was introduced into the vacuum chamber 5 to adjust the pressure to 3.1 Pa. A target 18 of an Al—AlN—Ti—TiN—WN—WO₃ alloy having a composition represented by $(Al)_{0.63}(AlN)_{0.07}(Ti)_{0.10}(TiN)_{0.10}(WN)_{0.03}(WO_3)_{0.07}$ by atomic ratio was attached to an arc discharge evaporation source 27 connected to the arc discharge power source 12.

With negative DC voltage of −80 V applied from the bias power source 3 to each substrate, and with pulse arc current having a substantially rectangular waveform supplied from the arc discharge power source 12 to the target 18, a 3-μm-thick coating having a composition represented by $(Al_{0.71}Ti_{0.20}W_{0.09})_{0.48}N_{0.44}O_{0.08}$ by atomic ratio was formed. The composition of the coating was measured at its thickness-direction center position by an electron probe microanalyzer EPMA (JXA-8500F available from Joel Ltd.) under the conditions of acceleration voltage of 10 kV, irradiation current of 0.05 A, and a beam diameter of 0.5 μm. Incidentally, the same measurement conditions of EPMA were used in other examples. As shown in FIG. 2, the pulse arc current had the minimum value $A_{min}$ of 65 A, the maximum value $A_{max}$ of 95 A, a frequency of 5 kHz (period T=2.0×10⁻⁴ seconds/pulse), and a duty ratio D of 50%.

Figure 3:
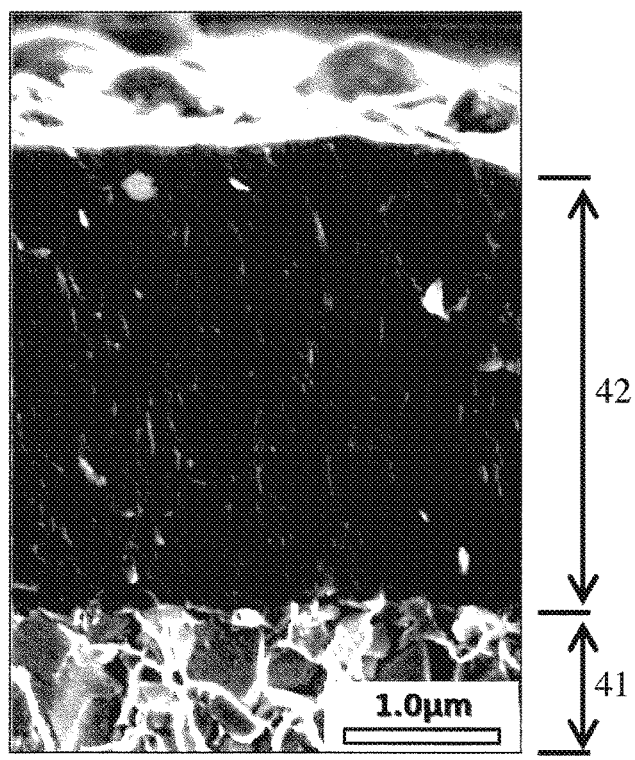
FIG. 3 is a scanning electron photomicrograph (magnification: 25,000 times) showing a cross section of the hard-coated tool of Example 1.

FIG. 3 is a scanning electron photomicrograph (SEM photograph, magnification: 25,000 times) showing a cross-section structure of the resultant (AlTiW)NO-coated milling insert. In FIG. 3, 41 represents the WC-based cemented carbide substrate, and 42 represents the (AlTiW)NO coating. Because of low magnification, the modified layer is not discernible in FIG. 3.

(4) Bonding States of Ti, W and Al in (AlTiW)NO Coating

Figure 4:
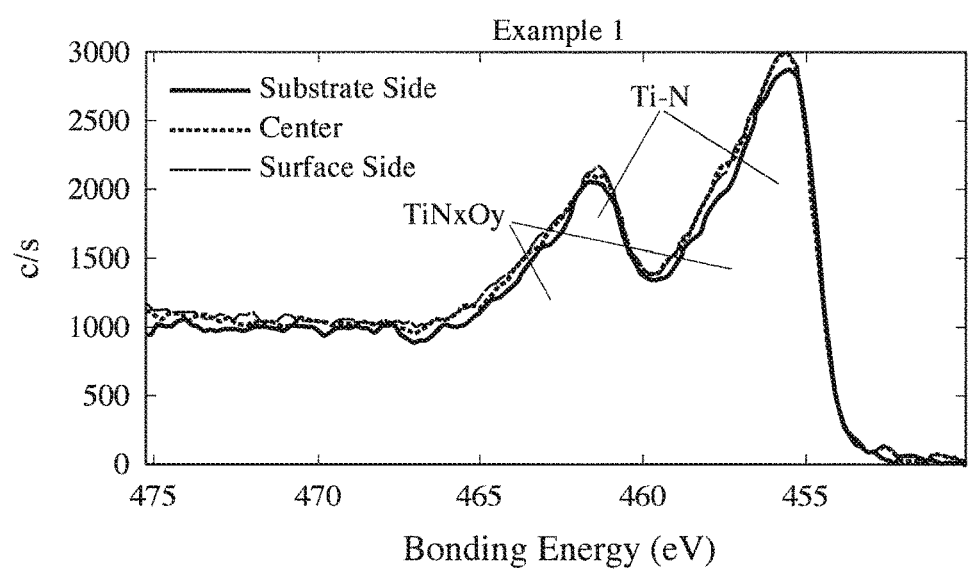
FIG. 4 is a graph showing X-ray photoelectron spectra indicating the bonding state of Ti in three cross sections of the (AlTiW)NO coating of Example 1.
Figure 5:
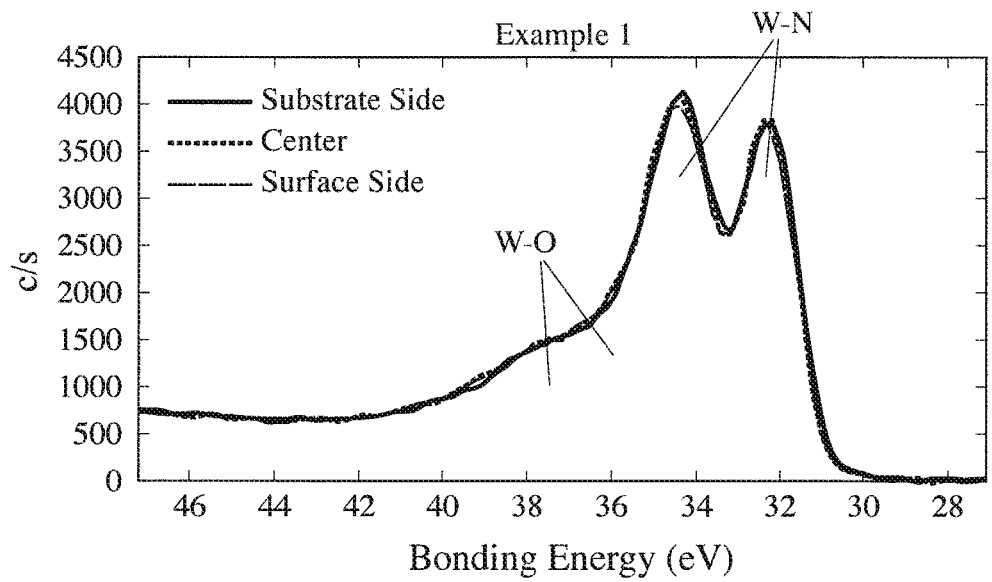
FIG. 5 is a graph showing X-ray photoelectron spectra indicating the bonding state of W in three cross sections of the (AlTiW)NO coating of Example 1.
Figure 6:
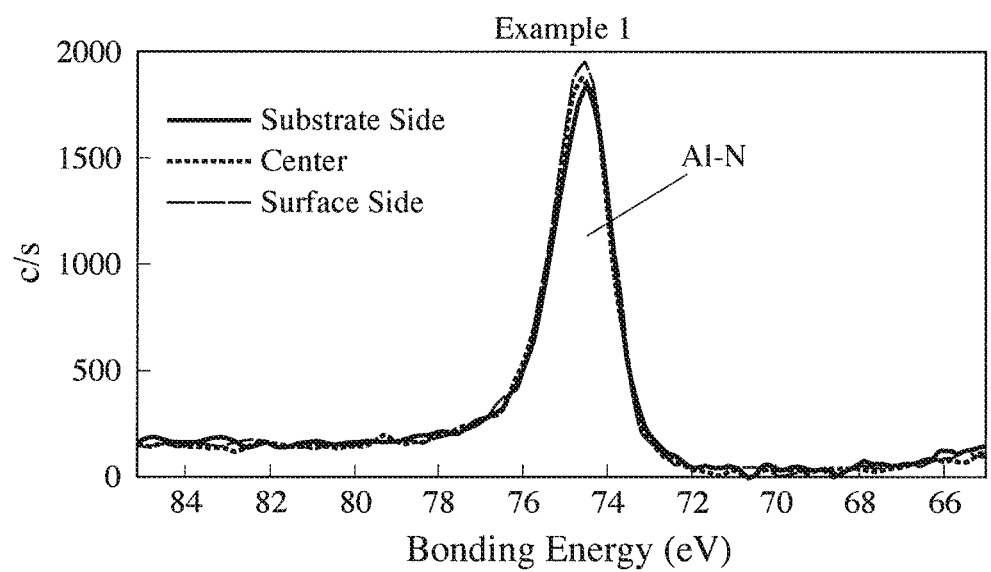
FIG. 6 is a graph showing X-ray photoelectron spectra indicating the bonding state of Al in three cross sections of the (AlTiW)NO coating of Example 1.

Using an X-ray photoelectron spectroscope (Quantum 2000 available from PHI), the (AlTiW)NO coating was etched with argon ions to expose its surface-side portion as deep as ⅙ of the thickness of the coating from the surface, and this portion was irradiated with $AlK\alpha_1$ rays (wavelength λ: 0.833934 nm) to obtain a spectrum indicating the bonding states of Ti, W and Al. Further, the (AlTiW)NO coating was etched as deep as ½ (center) and ⅚ (substrate side) of the thickness of the coating from the surface, to obtain spectra indicating the bonding states of Ti, W and Al. In FIGS. 4-6 showing spectra indicating the bonding states of Ti, W and Al at each depth, the axis of abscissa indicates bonding energy (eV), and the axis of ordinates indicates C/S (count per second). It was confirmed that any bonding states of Ti, W and Al were substantially the same at three measurement positions.

FIG. 4 shows peaks of TiNxOy (a ratio of x to y was not found) and T-N, FIG. 5 shows peaks of W—O and W—N, and FIG. 6 shows peaks of Al—N. In the X-ray photoelectron spectrum of FIG. 6, Al—O bonds were not observed, but only Al—N bonds were observed. Though an exact ratio of x to y in TiNxOy was not known from the X-ray photoelectron spectrum of FIG. 4, it is confirmed from the above EPMA values of the (AlTiW)NO coating (see the column of Example 1 in Table 3-2 below) that TiNxOy is nitride-based Ti oxynitride. Because two W—O peaks at 35.7-36.0 eV and 37.4 eV are overlapped in FIG. 5, FIG. 5 shows smooth W—O peaks. Also, two W—N peaks were observed at 32.8 eV and 34.8 eV in FIG. 5. It is clear from FIGS. 4-6 that W—O bonds independently exist in the (AlTiW)NO coating, with suppressed oxidation of Ti and Al.

(5) X-Ray Diffraction Pattern of (AlTiW)NO Coating

To measure the crystal structure and crystal orientation of a (AlTiW)NO coating on the property-measuring insert substrate, an X-ray diffraction pattern (FIG. 7) was obtained by $CuK\alpha_1$ rays (wavelength λ: 0.15405 nm) irradiated from an X-ray diffraction apparatus (EMPYREAN available from Panalytical) under the following conditions.

Tube voltage: 45 kV,
Tube current: 40 mA,
Incident angle ω: fixed at 3°, and
2θ: 30-80°.

Figure 7:
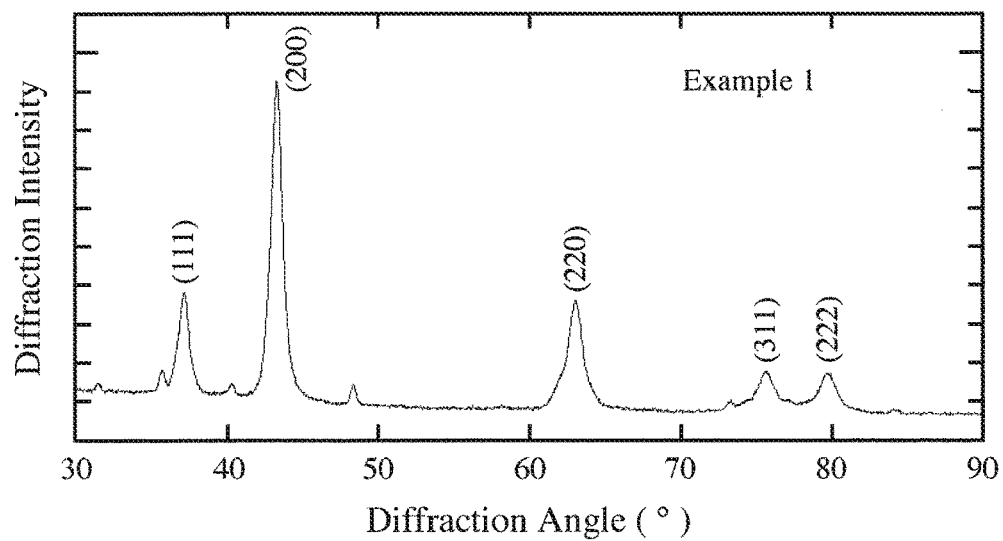
FIG. 7 is a graph showing an X-ray diffraction pattern of the (AlTiW)NO coating of Example 1.

In FIG. 7, X-ray diffraction peaks at planes of (111), (200), (220), (311) and (222) are assigned to the NaCl-type structure. It was thus confirmed that the (AlTiW)NO coating of Example 1 had only a NaCl-type structure.

Table 1 shows standard X-ray diffraction intensities $I_0$ and 2θ of TiN described in ICCD Reference Code 00-038-1420. TiN has the same NaCl-type structure as that of (AlTiW)NO. Because the (AlTiW)NO coating of the present invention is a solid solution obtained by substituting part of Ti in TiN by Al and W and adding 0, the numbers shown in Table 1 were used as standard X-ray diffraction intensities $I_0$ (hkl).

TABLE 1

| Miller Index | $I_0$ | 2θ (°) |
|---|---|---|
| (111) | 72 | 36.66 |
| (200) | 100 | 42.60 |
| (220) | 45 | 61.82 |
| (311) | 19 | 74.07 |
| (222) | 12 | 77.96 |

Table 2 shows an X-ray diffraction intensity (measured value) of each plane determined by the X-ray diffraction pattern of FIG. 7, and an X-ray diffraction peak intensity ratio of each plane calculated with the X-ray diffraction peak intensity of a (200) plane, a strongest peak plane of X-ray diffraction, as a reference. The peak angles 2θ of the (AlTiW)NO coating were shifted toward a higher angle side in Table 2 than in Table 1, presumably because strain was generated in the (AlTiW)NO coating by the addition of other elements such as Al, etc. to TiN.

TABLE 2

| Miller Index | 2θ (°) | X-Ray Diffraction Intensity[1] | X-Ray Diffraction Peak Intensity Ratio of (AlTiW)NO |
|---|---|---|---|
| (111) | 37.56 | 34 | 0.47 |
| (200) | 43.24 | 100 | 1.00 |
| (220) | 62.91 | 33 | 0.73 |
| (311) | 75.64 | 15 | 0.79 |
| (222) | 79.73 | 15 | 0.80 |

[1]Measured value.

(6) Microstructures of Modified Layer and (AlTiW)NO Coating

Figure 8:
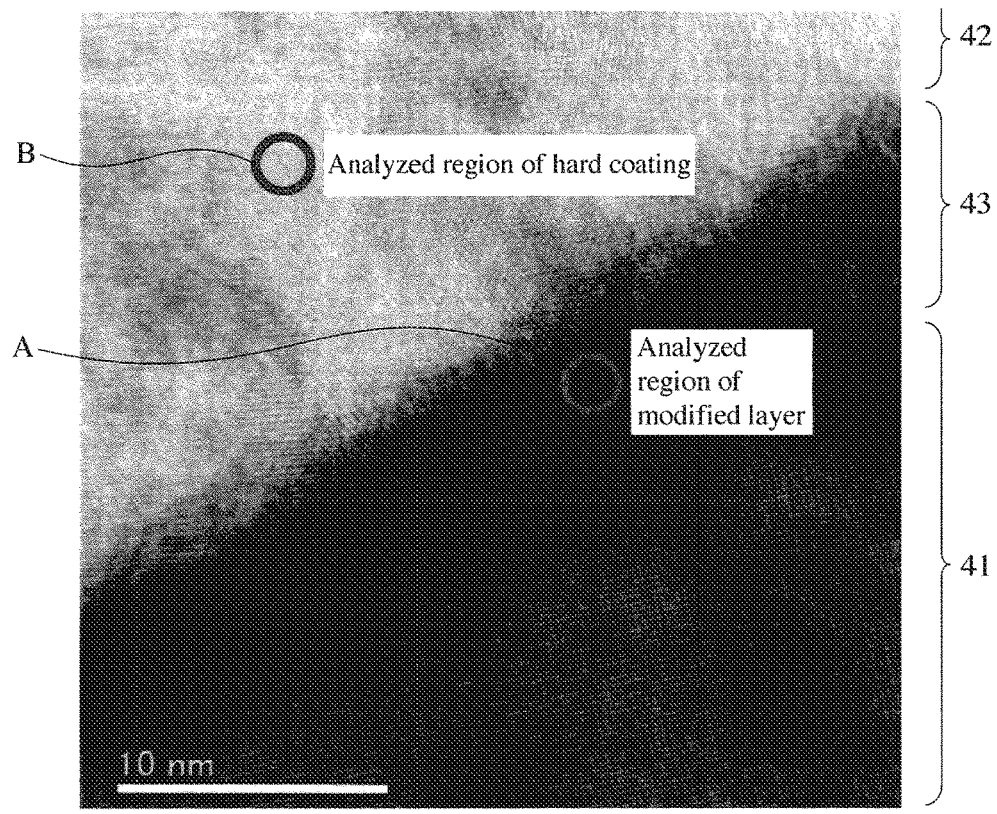
FIG. 8 is a transmission electron photomicrograph (magnification: 3,600,000 times) showing a near-modified-layer cross section of the hard-coated member (insert) of Example 1 having a modified layer between the WC-based cemented carbide substrate and the hard coating.
Figure 9A:
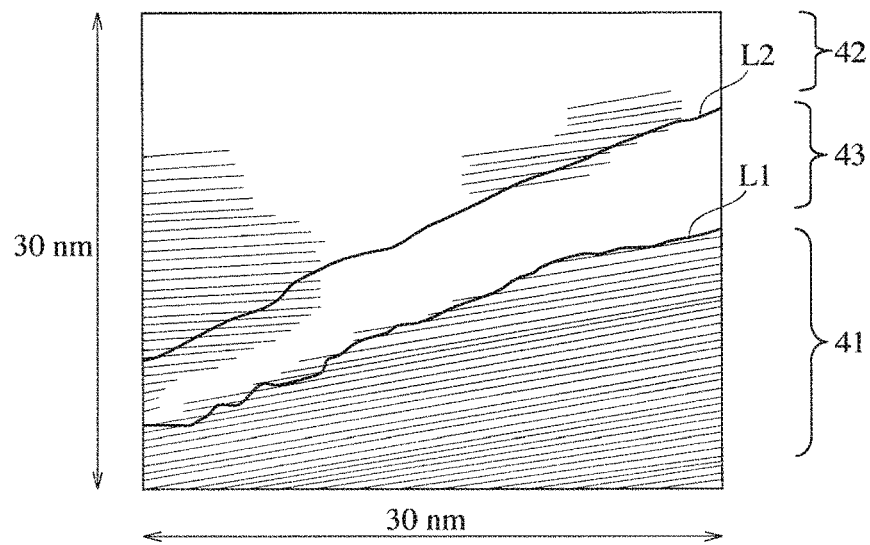
FIG. 9(a) is a schematic view of the transmission electron photomicrograph of FIG. 8.

A cross section of the (AlTiW)NO coating on the property-measuring insert was observed by a transmission electron microscope (TEM, JEM-2100 available from JEOL, Ltd.). FIG. 8 is a TEM photograph (magnification: 3,600,000 times, field: 30 nm×30 nm) showing a portion including the interfaces of the WC-based cemented carbide substrate, the modified layer and the (AlTiW)NO coating. FIG. 9(a) is a schematic view of FIG. 8. In FIG. 9(a), a line $L_1$ indicates an interface between the WC-based cemented carbide substrate 41 and the modified layer 43, a line $L_2$ indicates an interface between the modified layer 43 and the (AlTiW)NO coating 42, and large numbers of parallel thin lines indicate crystal lattice fringes. FIG. 9(a) indicates that among the interface of the modified layer 43 and the (AlTiW)NO coating 42, a portion having continuous crystal lattice fringes was about 30% or more.

Figure 9B:
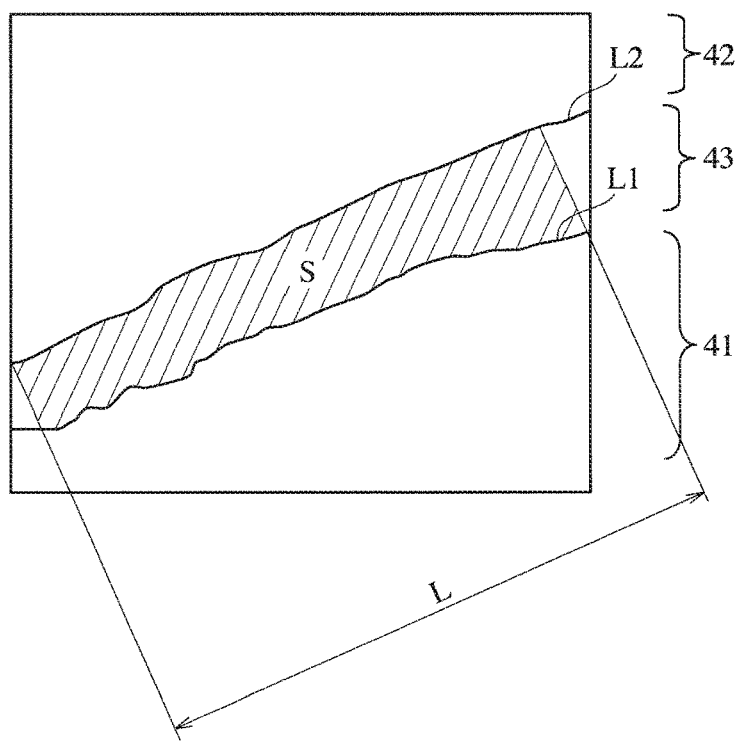
FIG. 9(b) is a schematic view showing a method for determining the average thickness of a modified layer.

In FIG. 9(b) corresponding to FIG. 9(a), the average thickness $D_1$ of the modified layer 43 in one field can be determined by dividing an area S of the modified layer 43 encircled by the lines $L_1$ line $L_2$ by the length L of the modified layer 43. The average thicknesses $D_1$, $D_2$, $D_3$, $D_4$, $D_5$ of the modified layer 43 in five different fields were determined by the same method, and averaged to obtain the average thickness Da [($D_1+D_2+D_3D_4+D_5$)/5] of the modified layer 43. The average thickness Da of the modified layer 43 determined by this method was 6 nm.

Figure 10:
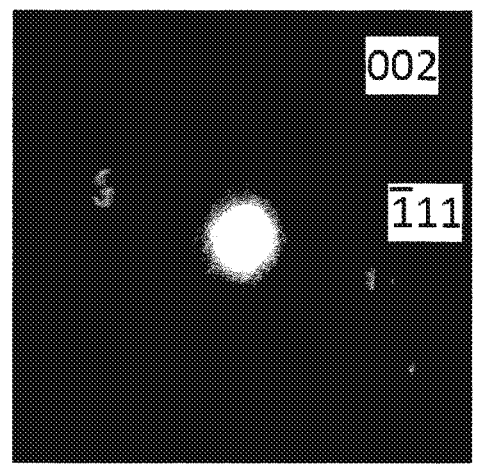
FIG. 10 is a view showing an analysis result of the crystal structure of the modified layer of Example 1 on its nano-beam diffraction image.
Figure 11:
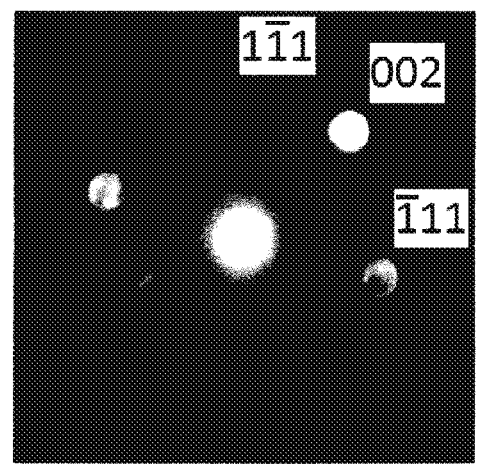
FIG. 11 is a view showing an analysis result of the crystal structure of the (AlTiW)NO coating of Example 1 on its nano-beam diffraction image.

Using JEM-2100, the nano-beam diffraction of the modified layer 43 was measured substantially at a thickness-direction center (shown by a circle A in FIG. 8) at acceleration voltage of 200 kV and camera length of 50 cm. The resultant diffraction image is shown in FIG. 10. The nano-beam diffraction of the (AlTiW)NO coating was also measured at an arbitrary position (shown by a circle B in FIG. 8) under the same conditions. The resultant diffraction image is shown in FIG. 11. FIG. 10 indicates that the modified layer formed by ion bombardment using a $Ti_{0.85}O_{0.15}$ target had an Fcc structure. FIG. 11 indicates that the (AlTiW)NO coating of the present invention also had an Fcc structure.

Figure 12:
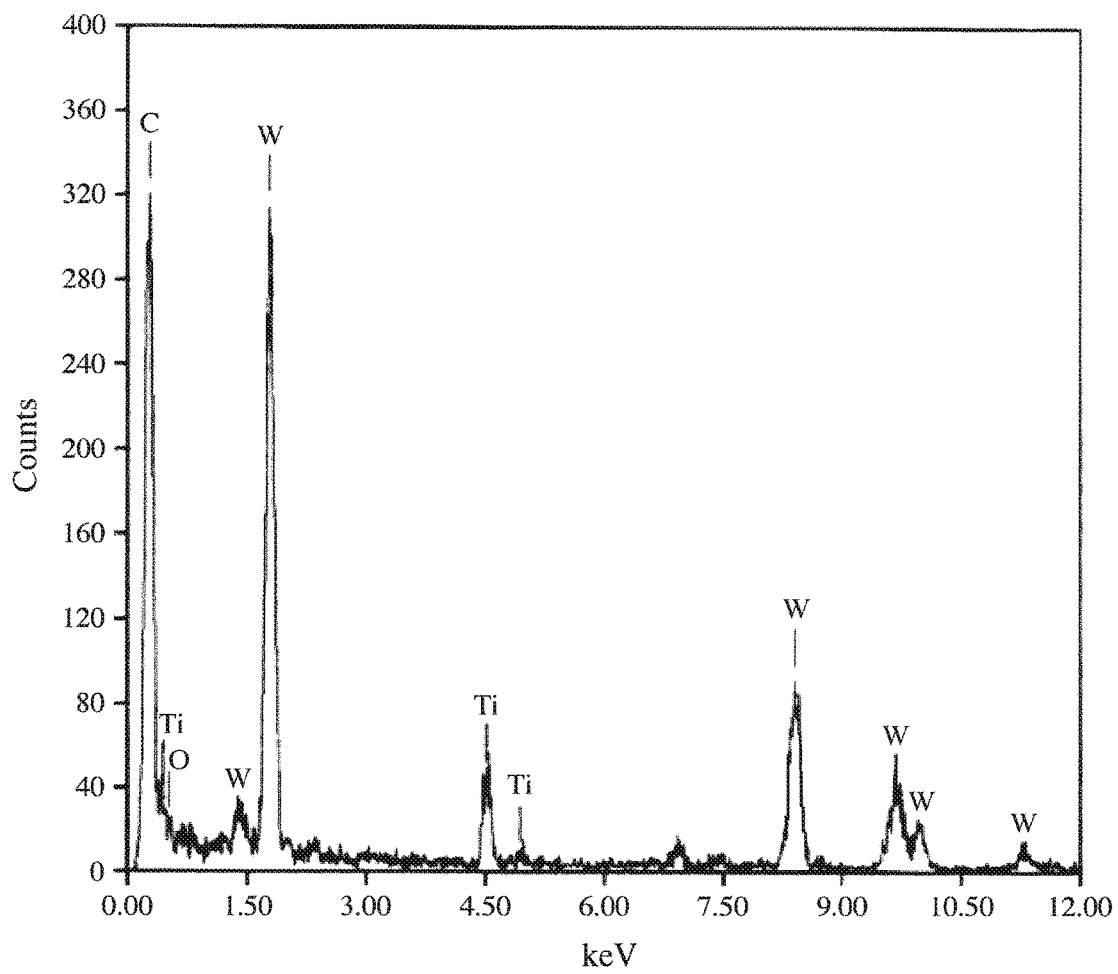
FIG. 12 is a graph showing an energy-dispersive X-ray spectrum of a cross section of the modified layer of Example 1.

The qualitative analysis of the composition of the modified layer 43 at a thickness-direction center shown by a circle A in FIG. 8 was conducted by a UTW-type Si (Li) semiconductor detector attached to JEM-2100, at a beam diameter of 1 nm. The resultant spectrum is shown in FIG. 12. In FIG. 12, the axis of abscissa indicates keV, and the axis of ordinates indicates counts (accumulated intensity). FIG. 12 indicates that the modified layer 43 is a compound comprising at least Ti, W, C and O.

Figure 13:
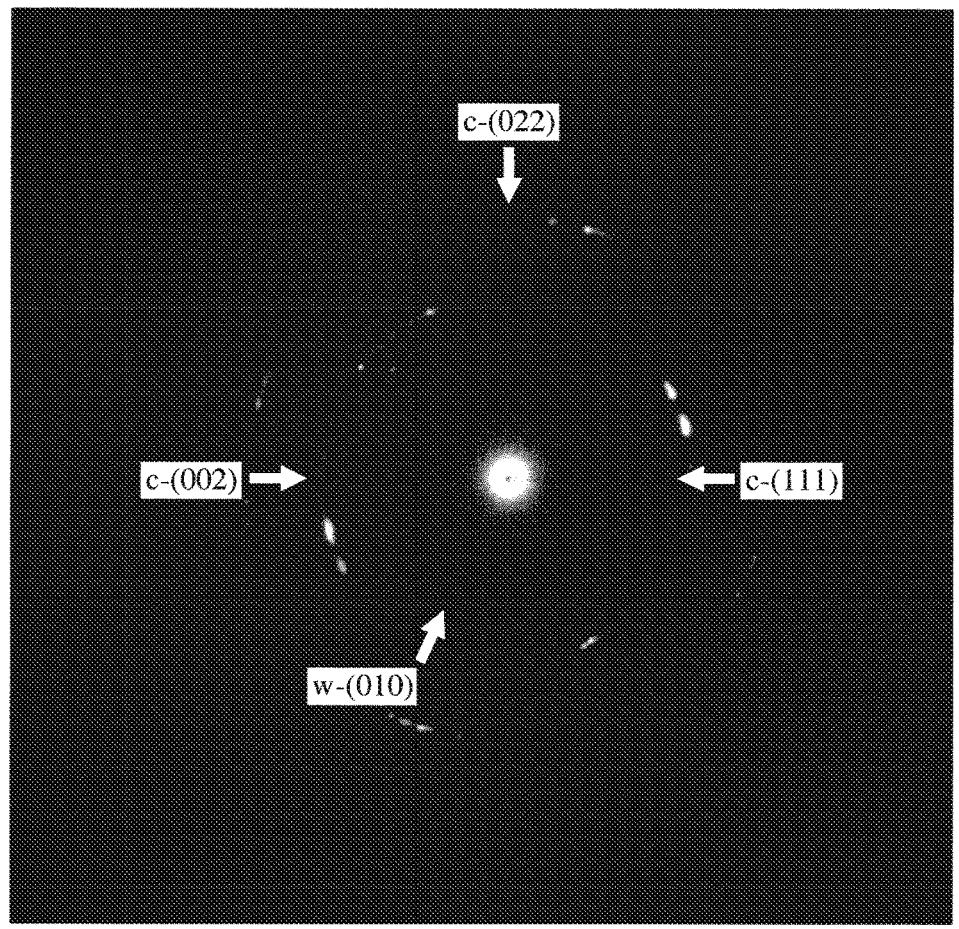
FIG. 13 is a photograph showing a selected-area diffraction image of the (AlTiW)NO coating of Example 1.

Using a transmission electron microscope (TEM, JEM-2100), a selected-field diffraction pattern (FIG. 13) of the (AlTiW)NO coating on the property-measuring insert was obtained at acceleration voltage of 200 kV and camera length of 50 cm. c-(111), c-(002) and c-(022) indicate the diffraction spots of the NaCl-type structure, and w-(010) indicates the diffraction spot of the wurtzite-type structure. It is clear from the selected-field diffraction pattern of TEM of FIG. 13 that the (AlTiW)NO coating on the property-measuring insert had a NaCl-type structure as a main structure, and a wurtzite-type structure as a sub-structure.

(7) Measurement of Droplets

Figure 16:
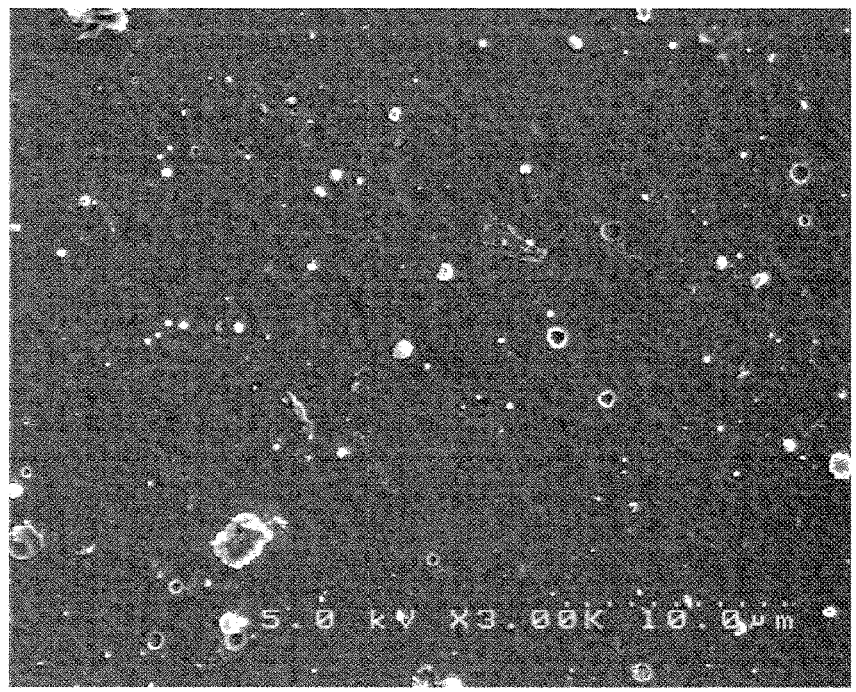
FIG. 16 is scanning electron photomicrograph (magnification: 3,000 times) showing a surface of the (AlTiW)NO coating of Example 1.
Figure 17:
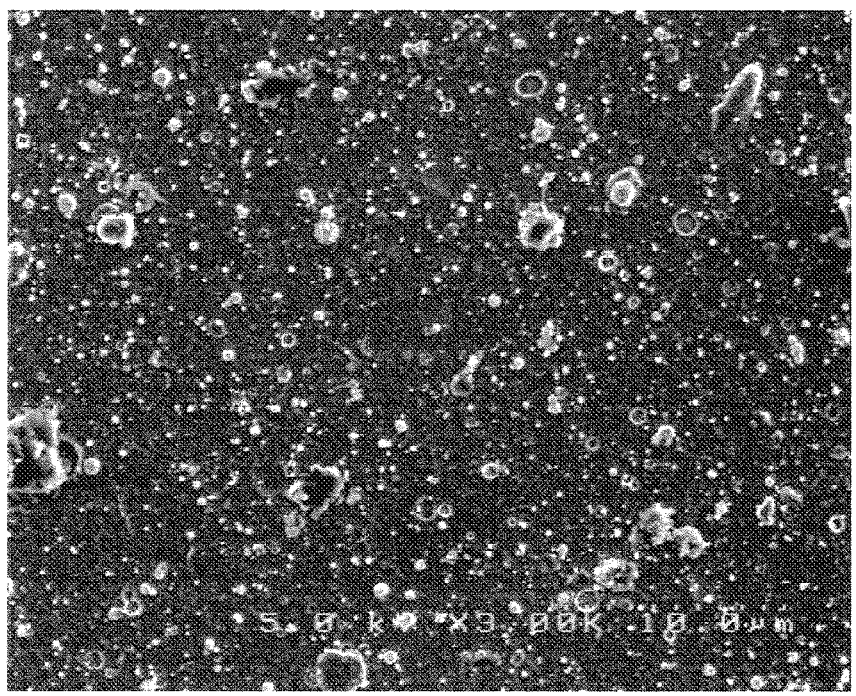
FIG. 17 is a scanning electron photomicrograph (magnification: 3,000 times) showing a surface of the (AlTiW)NO coating of Comparative Example 19.

FIG. 16 is a SEM photograph (magnification: 3,000 times) showing a surface of the (AlTiW)NO coating on the property-measuring insert. In a field of 35 μm vertical×40 μm horizontal of this SEM photograph, droplets having diameters of 1 μm or more were counted. As a result, the number of droplets on a surface of the (AlTiW)NO coating of Example 1 was 6/field, extremely smaller than the number of droplets on a surface of the (AlTiW)NO coating of Comparative Example 19 described below (FIG. 17).

(8) Measurement of Tool Life

Figure 15:
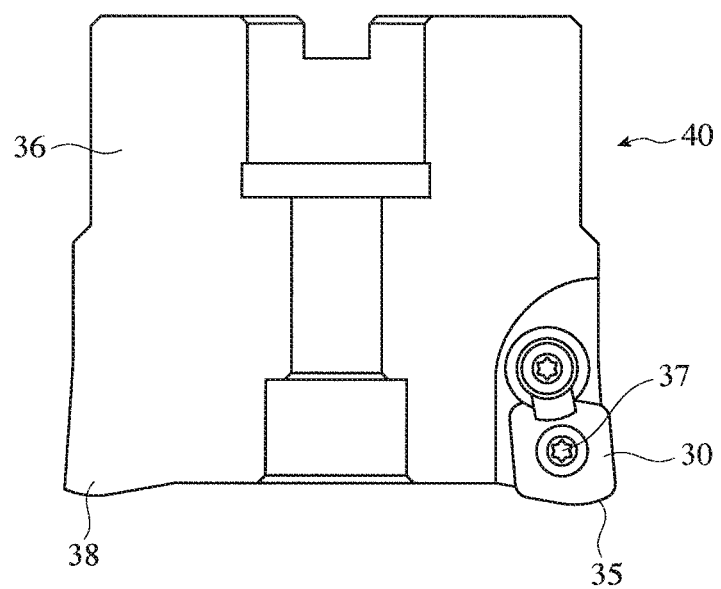
FIG. 15 is a schematic view showing an example of indexable rotary cutting tools, to which inserts are attached.

As shown in FIG. 15, four high-feed milling inserts 30 each having the (AlTiW)NO coating were fixed to a tip end portion 38 of a tool body 36 of an indexable rotary cutting tool (ASR5063-4 available from Hitachi Tool Engineering, Ltd.) 40 by screws 37. The tool 40 had an edge diameter of 63 mm. The inserts 30 used for cutting under the following milling conditions were collected every unit time to observe their flanks by an optical microscope (magnification: 100 times). The cutting time when the wear width or chipping width of each flank reached 0.3 mm or more was judged as a tool life.

Cutting conditions

| | |
|---|---|
| Cutting method: | High-feed, continuous milling, |
| Work: | S50C rod of 123 mm × 250 mm having a rectangular cross section, |
| Insert used: | EDNW15T4TN-15 (milling), |
| Cutting tool: | ASR5063-4, |
| Cutting speed: | 200 m/minute, |
| Feed per one blade: | 1.83 mm/edge, |
| Longitudinal cutting depth: | 1.0 mm, |
| Radial cutting depth: | 42.5 mm, and |
| Cutting liquid: | No (dry cutting). |

The composition of each target used for forming the (AlTiW)NO coating is shown in Table 3-1; the composition of each (AlTiW)NO coating is shown in Table 3-2; and the crystal structure measured by X-ray diffraction and electron beam diffraction and the existence of W—O bonds in each (AlTiW)NO coating, and the life of each tool are shown in Table 3-3.

Examples 2-9, and Comparative Examples 1-9

A hard coating was formed on each milling insert and evaluated in the same manner as in Example 1, except for using a coating-forming target having the composition shown in Table 3-1. The composition of each target is shown in Table 3-1; the composition of each coating is shown in Table 3-2; and the crystal structure measured by X-ray diffraction and electron beam diffraction and the existence of W—O bonds in each coating, and the life of each tool are shown in Table 3-3.

TABLE 3-1

| No. | Target Composition (atomic ratio) | | | | | |
|---|---|---|---|---|---|---|
| | Al (p) | AlN (q) | Ti (r) | TiN (s) | WN (t) | $WO_3$ (u) |
| Example 1 | 0.63 | 0.07 | 0.10 | 0.10 | 0.03 | 0.07 |
| Example 2 | 0.73 | 0.05 | 0.05 | 0.10 | 0.03 | 0.04 |
| Example 3 | 0.80 | 0.06 | 0.04 | 0.03 | 0.03 | 0.04 |
| Example 4 | 0.60 | 0.05 | 0.15 | 0.13 | 0.03 | 0.04 |
| Example 5 | 0.60 | 0.04 | 0.15 | 0.14 | 0.03 | 0.04 |
| Example 6 | 0.75 | 0.04 | 0.04 | 0.03 | 0.10 | 0.04 |
| Example 7 | 0.70 | 0.07 | 0.10 | 0.10 | 0.01 | 0.02 |
| Example 8 | 0.70 | 0.07 | 0.06 | 0.06 | 0.03 | 0.08 |
| Example 9 | 0.69 | 0.06 | 0.10 | 0.08 | 0.06 | 0.01 |
| Com. Ex. 1 | 0.79 | 0.10 | 0.05 | 0.02 | 0.02 | 0.02 |
| Com. Ex. 2 | 0.45 | 0.10 | 0.10 | 0.30 | 0.01 | 0.04 |
| Com. Ex. 3 | 0.56 | 0.05 | 0.16 | 0.20 | 0.01 | 0.02 |
| Com. Ex. 4 | 0.75 | 0.08 | 0.01 | 0.01 | 0.10 | 0.05 |
| Com. Ex. 5 | 0.60 | 0.05 | 0.05 | 0.04 | 0.22 | 0.04 |
| Com. Ex. 6 | 0.65 | 0.08 | 0.15 | 0.11 | 0.00 | 0.01 |
| Com. Ex. 7 | 0.70 | 0.08 | 0.03 | 0.08 | 0.02 | 0.09 |
| Com. Ex. 8 | 0.70 | 0.06 | 0.09 | 0.02 | 0.12 | 0.01 |
| Com. Ex. 9 | 0.70 | 0.07 | 0.09 | 0.07 | 0.07 | 0.00 |

TABLE 3-2

| No. | Type of Coating | (AlTiW)NO Coating Composition (atomic ratio) | | | | | |
|---|---|---|---|---|---|---|---|
| | | Al (x) | Ti (y) | W (z) | AlTiW (a) | N (1-a-b) | O (b) |
| Example 1 | (AlTiW)NO | 0.71 | 0.20 | 0.09 | 0.48 | 0.44 | 0.08 |
| Example 2 | (AlTiW)NO | 0.79 | 0.10 | 0.11 | 0.50 | 0.44 | 0.06 |
| Example 3 | (AlTiW)NO | 0.60 | 0.31 | 0.09 | 0.45 | 0.48 | 0.07 |
| Example 4 | (AlTiW)NO | 0.60 | 0.35 | 0.05 | 0.47 | 0.47 | 0.06 |
| Example 5 | (AlTiW)NO | 0.75 | 0.08 | 0.17 | 0.45 | 0.47 | 0.08 |
| Example 6 | (AlTiW)NO | 0.68 | 0.14 | 0.18 | 0.48 | 0.46 | 0.06 |
| Example 7 | (AlTiW)NO | 0.72 | 0.25 | 0.03 | 0.53 | 0.44 | 0.03 |
| Example 8 | (AlTiW)NO | 0.73 | 0.16 | 0.11 | 0.47 | 0.43 | 0.10 |
| Example 9 | (AlTiW)NO | 0.71 | 0.21 | 0.08 | 0.49 | 0.48 | 0.03 |
| Com. Ex. 1 | (AlTiW)NO | 0.90 | 0.05 | 0.05 | 0.52 | 0.43 | 0.05 |
| Com. Ex. 2 | (AlTiW)NO | 0.50 | 0.40 | 0.10 | 0.44 | 0.50 | 0.06 |
| Com. Ex. 3 | (AlTiW)NO | 0.55 | 0.40 | 0.05 | 0.55 | 0.41 | 0.04 |
| Com. Ex. 4 | (AlTiW)NO | 0.80 | 0.02 | 0.18 | 0.43 | 0.51 | 0.06 |
| Com. Ex. 5 | (AlTiW)NO | 0.61 | 0.11 | 0.28 | 0.44 | 0.49 | 0.07 |
| Com. Ex. 6 | (AlTiW)NO | 0.69 | 0.30 | 0.01 | 0.49 | 0.50 | 0.01 |
| Com. Ex. 7 | (AlTiW)NO | 0.73 | 0.15 | 0.12 | 0.44 | 0.42 | 0.14 |
| Com. Ex. 8 | (AlTiW)NO | 0.72 | 0.17 | 0.11 | 0.47 | 0.52 | 0.01 |
| Com. Ex. 9 | (AlTiW)N | 0.72 | 0.19 | 0.09 | 0.52 | 0.48 | 0.00 |

TABLE 3-3

| No. | (AlTiW)NO Coating | | | |
|---|---|---|---|---|
| | Crystal Structure | | W—O Bonds | Tool Life (minute) |
| | X-Ray Diffraction | Electron Beam Diffraction | | |
| Example 1 | NaCl-type [1] | NaCl-type [2] | Yes | 55 |
| Example 2 | NaCl-type [1] | NaCl-type [2] | Yes | 47 |
| Example 3 | NaCl-type [1] | NaCl-type [2] | Yes | 44 |
| Example 4 | NaCl-type [1] | NaCl-type [2] | Yes | 42 |
| Example 5 | NaCl-type [1] | NaCl-type [2] | Yes | 38 |
| Example 6 | NaCl-type [1] | NaCl-type [2] | Yes | 47 |
| Example 7 | NaCl-type [1] | NaCl-type [2] | Yes | 37 |
| Example 8 | NaCl-type [1] | NaCl-type [2] | Yes | 49 |
| Example 9 | NaCl-type [1] | NaCl-type [2] | Yes | 35 |
| Com. Ex. 1 | Wurtzite-type [1] | Wurtzite-type [2] | No | 15 |
| Com. Ex. 2 | NaCl-type [1] | NaCl-type [2] | Yes | 21 |
| Com. Ex. 3 | NaCl-type [1] | NaCl-type [2] | Yes | 22 |
| Com. Ex. 4 | — | — | Yes | 14 |
| Com. Ex. 5 | — | — | Yes | 20 |
| Com. Ex. 6 | NaCl-type [1] | NaCl-type [2] | No | 21 |
| Com. Ex. 7 | NaCl-type [1] | NaCl-type [2] | Yes | 18 |
| Com. Ex. 8 | NaCl-type [1] | NaCl-type [2] | No | 22 |
| Com. Ex. 9 | NaCl-type [1] | NaCl-type [2] | No | 17 |

Note:
[1] Single structure.
[2] Main structure.

As is clear from Table 3-3, the hard coatings of Examples 1-9 had W—O bonds. It was confirmed by X-ray photoelectron spectra that the hard coatings of Examples 1-9 contained substantially no Al—O bond. Accordingly, the hard-coated inserts of Examples 1-9 had as long lives as 35 minutes or more.

On the contrary, the hard-coated inserts of Comparative Examples 1-9 had as short lives as 22 minutes or less. Reasons therefor are as follows. The hard coating of Comparative Example 1 had poor wear resistance, because its main structure was a wurtzite-type structure. The hard coating of Comparative Example 1 did not have W—O bonds because of an excessive Al content. The hard coating of Comparative Examples 2 and 3 had poor oxidation resistance and wear resistance because of too little Al content (excessive Ti content). The hard coating of Comparative Example 4 had an amorphous structure because of too little Ti content, resulting in poor wear resistance. The hard coating of Comparative Example 5 had an amorphous structure because of an excessive W content, resulting in poor wear resistance. The hard coating of Comparative Example 6 had no W—O bonds because of too little W content, resulting in poor wear resistance. The hard coating of Comparative Example 7 contained O excessively, resulting in excessively oxidized Ti and thus poor wear resistance. The hard coating of Comparative Example 8 had low strength because of too little O content. The hard coating of Comparative Example 9 contained no W—O bonds because the target was (AlTiW)N, resulting in poor oxidation resistance and wear resistance.

Examples 10 and 11, and Comparative Examples 10 and 11

To investigate the influence of a substrate temperature on an (AlTiW)NO coating, an (AlTiW)NO coating was formed on each milling insert and evaluated in the same manner as in Example 1, except for changing the substrate temperature to 400° C. (Example 10), 540° C. (Example 11), 300° C. (Comparative Example 10), and 700° C. (Comparative Example 11), respectively. The composition of each (AlTiW)NO coating is shown in Table 4-1; and the crystal structure measured by X-ray diffraction and electron beam diffraction and the existence of W—O bonds in each (AlTiW)NO coating, and the tool life are shown in Table 4-2.

TABLE 4-1

| | (AlTiW)NO Coating Composition (atomic ratio) | | | | | |
|---|---|---|---|---|---|---|
| No. | Al (x) | Ti (y) | W (z) | AlTiW (a) | N (1-a-b) | O (b) |
| Example 1 | 0.71 | 0.20 | 0.09 | 0.48 | 0.44 | 0.08 |
| Example 10 | 0.72 | 0.19 | 0.09 | 0.45 | 0.48 | 0.07 |
| Example 11 | 0.69 | 0.23 | 0.08 | 0.46 | 0.47 | 0.07 |
| Com. Ex. 10 | 0.70 | 0.20 | 0.10 | 0.47 | 0.46 | 0.07 |
| Com. Ex. 11 | 0.67 | 0.22 | 0.11 | 0.45 | 0.48 | 0.07 |

TABLE 4-2

| | (AlTiW)NO coating | | | |
|---|---|---|---|---|
| | Crystal Structure | | | |
| No. | X-Ray Diffraction | Electron Beam Diffraction | W—O Bonds | Tool Life (minute) |
| Example 1 | NaCl-type [1] | NaCl-type [2] | Yes | 55 |
| Example 10 | NaCl-type [1] | NaCl-type [2] | Yes | 51 |
| Example 11 | NaCl-type [1] | NaCl-type [2] | Yes | 50 |
| Com. Ex. 10 | NaCl-type [1] | NaCl-type [2] | No | 19 |
| Com. Ex. 11 | Wurtzite-type [1] | Wurtzite-type [1] | — | 20 |

Note:
[1] Single structure.
[2] Main structure.

As is clear from Table 4-2, the tool lives were as long as 50 minutes or more in Examples 10 and 11, while they were as short as 19-20 minutes in Comparative Examples 10 and 11. Reasons therefor are that W—O bonds were not formed because of too low substrate temperature in Comparative Example 10, and the NaCl-type structure was not kept because of too high substrate temperature in Comparative Example 11.

Examples 12-14, and Comparative Examples 12 and 13

To investigate the influence of DC bias voltage on a (AlTiW)NO coating, an (AlTiW)NO coating was formed on each milling insert and evaluated in the same manner as in Example 1, except for applying DC bias voltage of −250 V in Example 12, −150 V in Example 13, −20 V in Example 14, −300 V in Comparative Example 12, and −10 V in Comparative Example 13. The composition of each (AlTiW)NO coating is shown in Table 5-1. The crystal structure measured by X-ray diffraction and electron beam diffraction and the existence of W—O bonds in each (AlTiW)NO coating, and the tool life are shown in Table 5-2.

TABLE 5-1

| | | (AlTiW)NO Coating Composition (atomic ratio) | | | | | |
|---|---|---|---|---|---|---|---|
| No. | DC Bias Voltage (V) | Al (x) | Ti (y) | W (z) | AlTiW (a) | N (1-a-b) | O (b) |
| Example 12 | −250 | 0.70 | 0.19 | 0.11 | 0.46 | 0.47 | 0.07 |
| Example 13 | −150 | 0.67 | 0.26 | 0.07 | 0.45 | 0.46 | 0.09 |
| Example 1 | −80 | 0.71 | 0.20 | 0.09 | 0.48 | 0.44 | 0.08 |
| Example 14 | −20 | 0.74 | 0.18 | 0.08 | 0.48 | 0.43 | 0.09 |
| Com. Ex. 12 | −300 | 0.68 | 0.21 | 0.11 | 0.50 | 0.42 | 0.08 |
| Com. Ex. 13 | −10 | 0.76 | 0.15 | 0.09 | 0.45 | 0.47 | 0.08 |

TABLE 5-2

| | (AlTiW)NO Coating | | | |
|---|---|---|---|---|
| | Crystal Structure | | | |
| No. | X-Ray Diffraction | Electron Beam Diffraction | W—O Bonds | Tool Life (minute) |
| Example 12 | NaCl-type [1] | NaCl-type [2] | Yes | 54 |
| Example 13 | NaCl-type [1] | NaCl-type [2] | Yes | 49 |
| Example 1 | NaCl-type [1] | NaCl-type [2] | Yes | 55 |
| Example 14 | NaCl-type [1] | NaCl-type [2] | Yes | 45 |
| Com. Ex. 12 | NaCl-type [1] | NaCl-type [2] | No | 28 |
| Com. Ex. 13 | NaCl-type [1] | NaCl-type [2] | No | 23 |

Note:
[1] Single structure.
[2] Main structure.

Examples 15-18, and Comparative Examples 14 and 15

To investigate the influence of unipolar pulse bias voltage on a (AlTiW)NO coating, an (AlTiW)NO coating was formed on each milling insert and evaluated in the same manner as in Example 1, except for applying unipolar pulse bias voltage of −250 V in Example 15, −150 V in Example 16, −80 V in Example 17, −20 V in Example 18, −300 V in Comparative Example 14, and −10 V in Comparative Example 15. Any unipolar pulse bias voltage had a frequency of 30 kHz. The composition of each (AlTiW)NO coating is shown in Table 5-3. The crystal structure measured by X-ray diffraction and electron beam diffraction and the existence of W—O bonds in each (AlTiW)NO coating, and the tool life are shown in Table 5-4.

TABLE 5-3

| No. | Unipolar Pulse Bias Voltage (V) | (AlTiW)NO Coating Composition (atomic ratio) | | | | | |
|---|---|---|---|---|---|---|---|
| | | Al (x) | Ti (y) | W (z) | AlTiW (a) | N (1-a-b) | O (b) |
| Example 15 | −250 | 0.71 | 0.20 | 0.09 | 0.49 | 0.45 | 0.06 |
| Example 16 | −150 | 0.69 | 0.24 | 0.07 | 0.42 | 0.49 | 0.09 |
| Example 17 | −80 | 0.70 | 0.21 | 0.09 | 0.48 | 0.42 | 0.10 |
| Example 18 | −20 | 0.73 | 0.18 | 0.09 | 0.46 | 0.46 | 0.08 |
| Com. Ex. 14 | −300 | 0.67 | 0.22 | 0.11 | 0.48 | 0.43 | 0.10 |
| Com. Ex. 15 | −10 | 0.77 | 0.15 | 0.08 | 0.45 | 0.46 | 0.09 |

TABLE 5-4

| | (AlTiW)NO Coating | | | |
|---|---|---|---|---|
| | Crystal Structure | | | |
| No. | X-Ray Diffraction | Electron Beam Diffraction | W—O Bonds | Tool Life (minute) |
| Example 15 | NaCl-type [1] | NaCl-type [2] | Yes | 50 |
| Example 16 | NaCl-type [1] | NaCl-type [2] | Yes | 47 |
| Example 17 | NaCl-type [1] | NaCl-type [2] | Yes | 50 |
| Example 18 | NaCl-type [1] | NaCl-type [2] | Yes | 42 |
| Com. Ex. 14 | NaCl-type [1] | NaCl-type [2] | No | 26 |
| Com. Ex. 15 | NaCl-type [1] | NaCl-type [2] | No | 22 |

Note:
[1] Single structure.
[2] Main structure.

As is clear from Tables 5-2 and 5-4, the tool lives were as long as 42 minutes or more in Examples 12-18, while they were as short as 22-28 minutes in Comparative Examples 12-15. Reasons therefor are that the (AlTiW)NO coatings were not well crystallized because of too high bias voltage, resulting in insufficient adhesion and poor wear resistance, in Comparative Examples 13 and 15, and that the (AlTiW)NO coatings were deteriorated by arcing due to too low bias voltage in Comparative Examples 12 and 14.

Examples 19 and 20, and Comparative Examples 16 and 17

To investigate the influence of a pulse arc current frequency on an (AlTiW)NO coating, an (AlTiW)NO coating was formed on each milling insert and evaluated in the same manner as in Example 1, except for changing the frequency to 2 kHz (Example 19), 14 kHz (Example 20), 0.5 kHz (Comparative Example 16), and 20 kHz (Comparative Example 17). The composition of each (AlTiW)NO coating is shown in Table 6-1. The crystal structure measured by X-ray diffraction and electron beam diffraction and the existence of W—O bonds in each (AlTiW)NO coating, and the tool life are shown in Table 6-2.

TABLE 6-1

| No. | (AlTiW)NO Coating Composition (atomic ratio) | | | | | |
|---|---|---|---|---|---|---|
| | Al (x) | Ti (y) | W (z) | AlTiW (a) | N (1-a-b) | O (b) |
| Example 1 | 0.71 | 0.20 | 0.09 | 0.48 | 0.44 | 0.08 |
| Example 19 | 0.70 | 0.20 | 0.10 | 0.50 | 0.43 | 0.07 |
| Example 20 | 0.68 | 0.22 | 0.10 | 0.46 | 0.45 | 0.09 |
| Com. Ex. 16 | 0.78 | 0.12 | 0.10 | 0.53 | 0.46 | 0.01 |
| Com. Ex. 17 | 0.69 | 0.22 | 0.09 | 0.52 | 0.43 | 0.03 |

TABLE 6-2

| | (AlTiW)NO Coating | | | |
|---|---|---|---|---|
| | Crystal Structure | | | |
| No. | X-Ray Diffraction | Electron Beam Diffraction | W—O Bonds | Tool Life (minute) |
| Example 1 | NaCl-type[1] | NaCl-type[2] | Yes | 55 |
| Example 19 | NaCl-type[1] | NaCl-type[2] | Yes | 47 |
| Example 20 | NaCl-type[1] | NaCl-type[2] | Yes | 45 |
| Com. Ex. 16 | NaCl-type[1] | NaCl-type[2] | No | 23 |
| Com. Ex. 17 | NaCl-type[1] | NaCl-type[2] | No | 22 |

Note:
[1] Single structure.
[2] Main structure.

As is clear from Table 6-2, the tool lives were as long as 45 minutes or more in Examples 19 and 20, while they were as short as 22-23 minutes in Comparative Examples 16 and 17. Reasons therefor are that in Comparative Example 16, a large amount of oxide is formed on the target, making the arc discharge unstable during forming the coating, thereby generating an uneven coating composition without forming W—O bonds, and that in Comparative Example 17, arc discharge is unstable because of too high frequency, failing to form W—O bonds in the coating.

Examples 21-25, Comparative Examples 18 and 19

To investigate the influence of $A_{min}$, $A_{max}$ and $\Delta A$ ($=A_{max}-A_{min}$) of pulse arc current on an (ATiW)NO coating, an (AlTiW)NO coating was formed on each milling insert and evaluated in the same manner as in Example 1, except for changing $A_{min}$, $A_{max}$ and $\Delta A$ as shown in Table 7. The composition of each (AlTiW)NO coating is shown in Table 8-1. The crystal structure measured by X-ray diffraction and electron beam diffraction and the existence of W—O bonds in each (AlTiW)NO coating, and the tool life are shown in Table 8-2.

TABLE 7

| | Pulse Arc Current of Arc Discharge Evaporation Source | | | | |
|---|---|---|---|---|---|
| No. | D[1] (%) | Frequency (kHz) | Amin (A) | Amax (A) | ΔA[2] (A) |
| Example 1 | 50 | 5 | 65 | 95 | 30 |
| Example 21 | 50 | 5 | 55 | 90 | 35 |
| Example 22 | 50 | 5 | 60 | 100 | 40 |
| Example 23 | 50 | 5 | 55 | 110 | 55 |
| Example 24 | 50 | 5 | 80 | 120 | 40 |
| Example 25 | 50 | 5 | 80 | 90 | 10 |

TABLE 7-continued

| | Pulse Arc Current of Arc Discharge Evaporation Source | | | | |
|---|---|---|---|---|---|
| No. | D[1] (%) | Frequency (kHz) | Amin (A) | Amax (A) | ΔA[2] (A) |
| Com. Ex. 18 | 50 | 5 | 40 | 130 | 90 |
| Com. Ex. 19 | — | — | 100 | 100 | 0 |

Note:
[1]Duty ratio.
[2]ΔA = Amax − Amin.

TABLE 8-1

| | (AlTiW)NO Coating Composition (atomic ratio) | | | | | |
|---|---|---|---|---|---|---|
| No. | Al (x) | Ti (y) | W (z) | AlTiW (a) | N (1-a-b) | O (b) |
| Example 1 | 0.71 | 0.20 | 0.09 | 0.48 | 0.44 | 0.08 |
| Example 21 | 0.73 | 0.18 | 0.09 | 0.49 | 0.43 | 0.08 |
| Example 22 | 0.73 | 0.16 | 0.11 | 0.43 | 0.48 | 0.09 |
| Example 23 | 0.72 | 0.18 | 0.10 | 0.52 | 0.46 | 0.02 |
| Example 24 | 0.67 | 0.22 | 0.11 | 0.49 | 0.43 | 0.08 |
| Example 25 | 0.69 | 0.18 | 0.13 | 0.48 | 0.43 | 0.09 |
| Com. Ex. 18 | 0.74 | 0.16 | 0.10 | 0.53 | 0.45 | 0.02 |
| Com. Ex. 19 | 0.75 | 0.21 | 0.04 | 0.52 | 0.47 | 0.01 |

TABLE 8-2

| | (AlTiW)NO Coating | | | |
|---|---|---|---|---|
| | Crystal Structure | | | |
| No. | X-Ray Diffraction | Electron Beam Diffraction | W—O Bonds | Tool Life (minute) |
| Example 1 | NaCl-type[1] | NaCl-type[2] | Yes | 55 |
| Example 21 | NaCl-type[1] | NaCl-type[2] | Yes | 50 |
| Example 22 | NaCl-type[1] | NaCl-type[2] | Yes | 51 |
| Example 23 | NaCl-type[1] | NaCl-type[2] | Yes | 51 |
| Example 24 | NaCl-type[1] | NaCl-type[2] | Yes | 45 |
| Example 25 | NaCl-type[1] | NaCl-type[2] | Yes | 47 |
| Com. Ex. 18 | NaCl-type[1] | NaCl-type[2] | No | 22 |
| Com. Ex. 19 | NaCl-type[1] | NaCl-type[2] | No | 19 |

Note:
[1]Single structure.
[2]Main structure.

As is clear from Tables 7 and 8, any (AlTiW)NO coatings of Examples 21-25 formed within the ranges of $A_{min}$=50-90 A, $A_{max}$=90-120 A and ΔA=10-55 A contained W—O bonds, providing long tool lives. On the other hand, the tools of Comparative Examples 18 and 19 had short lives. This is due to the fact that in Comparative Examples 18, $A_{min}$, $A_{max}$ and ΔA are outside the ranges of the present invention, and that in Comparative Example 19, non-pulse arc current was supplied, resulting in a large amount of oxide formed on the target, making the arc discharge unstable, and generating an uneven coating composition, so that W—O bonds were not formed in the coating. In addition, large numbers of droplets were formed on the coating surfaces in Comparative Examples 18 and 19, resulting in short lives. FIG. 17 is a SEM photograph showing the coating surface of Comparative Example 19. The number of droplets having diameters of 1 μm or more, which was measured on the SEM photograph of FIG. 17 in the same manner as in Example 1, was "17/field."

Examples 26 and 27, and Comparative Examples 20 and 21

To investigate the influence of a duty ratio D of $A_{min}$ in the pulse arc current on an (AlTiW)NO coating, an (AlTiW)NO coating was formed on each milling insert and evaluated in the same manner as in Example 1, except for changing the duty ratio D to 40% in Example 26, 65% in Example 27, 10% in Comparative Example 20, and 90% in Comparative Example 21. The composition of each (AlTiW)NO coating is shown in Table 9-1; and the crystal structure measured by X-ray diffraction and electron beam diffraction and the existence of W—O bonds in each (AlTiW)NO coating, and the tool life are shown in Table 9-2.

TABLE 9-1

| | (AlTiW)NO Coating Composition (atomic ratio) | | | | | |
|---|---|---|---|---|---|---|
| No. | Al (x) | Ti (y) | W (z) | AlTiW (a) | N (1-a-b) | O (b) |
| Example 1 | 0.71 | 0.20 | 0.09 | 0.48 | 0.44 | 0.08 |
| Example 26 | 0.73 | 0.20 | 0.07 | 0.49 | 0.43 | 0.08 |
| Example 27 | 0.69 | 0.23 | 0.08 | 0.43 | 0.48 | 0.09 |
| Com. Ex. 20 | 0.75 | 0.21 | 0.04 | 0.50 | 0.47 | 0.03 |
| Com. Ex. 21 | 0.65 | 0.30 | 0.05 | 0.48 | 0.47 | 0.05 |

TABLE 9-2

| | (AlTiW)NO Coating | | | |
|---|---|---|---|---|
| | Crystal Structure | | | |
| No. | X-Ray Diffraction | Electron Beam Diffraction | W—O Bonds | Tool Life (minute) |
| Example 1 | NaCl-type[1] | NaCl-type[2] | Yes | 55 |
| Example 26 | NaCl-type[1] | NaCl-type[2] | Yes | 52 |
| Example 27 | NaCl-type[1] | NaCl-type[2] | Yes | 50 |
| Com. Ex. 20 | NaCl-type[1] | NaCl-type[2] | No | 21 |
| Com. Ex. 21 | NaCl-type[1] | NaCl-type[2] | No | 20 |

Note:
[1]Single structure.
[2]Main structure.

As is clear from Table 9-2, the tools of Examples 26 and 27 had as long lives as 50 minutes or more, while those of Comparative Examples 20 and 21 had short lives. This is due to the fact that in Comparative Example 20, arc discharge was unstable due to too small a duty ratio D, so that W—O bonds were not formed in the coating, and that in Comparative Example 21, a large amount of oxide was formed on the target due to an excessive duty ratio D, making the arc discharge unstable, so that W—O bonds were not formed in the coating.

Examples 28 and 29

To investigate the influence of the thickness of a modified layer on the crystal structure of a coating and the tool life, an (AlTiW)NO coating was formed on each milling insert using the same $Ti_{0.85}O_{0.15}$ target (atomic ratio) as in Example 1 in the same manner as in Example 1, except for changing the average thickness of each modified layer formed on the WC-based cemented carbide substrate to 2 nm (Example 28) and 9 nm (Example 29) by changing the ion bombardment time. The composition of each (AlTiW)NO coating is shown in Table 10-1, and the crystal structure measured by X-ray diffraction and electron beam diffraction and the existence of W—O bonds in each (AlTiW)NO coating, the average thickness of the modified layer, and the tool life are shown in Table 10-2.

TABLE 10-1

(AlTiW)NO Coating Composition (atomic ratio)

| No. | Al (x) | Ti (y) | W (z) | AlTiW (a) | N (1-a-b) | O (b) |
|---|---|---|---|---|---|---|
| Example 1 | 0.71 | 0.20 | 0.09 | 0.48 | 0.44 | 0.08 |
| Example 28 | 0.72 | 0.19 | 0.09 | 0.50 | 0.44 | 0.06 |
| Example 29 | 0.71 | 0.19 | 0.10 | 0.47 | 0.47 | 0.06 |

TABLE 10-2

(AlTiW)NO Coating

| | Crystal Structure | | | | |
|---|---|---|---|---|---|
| No. | X-Ray Diffraction | Electron Beam Diffraction | W—O Bonds | Average Thickness of Modified Layer (nm) | Tool Life (minute) |
| Example 1 | NaCl-type[1] | NaCl-type[2] | Yes | 6 | 55 |
| Example 28 | NaCl-type[1] | NaCl-type[2] | Yes | 2 | 45 |
| Example 29 | NaCl-type[1] | NaCl-type[2] | Yes | 9 | 49 |

Note:
[1]Single structure.
[2]Main structure.

As is clear from Table 10-2, each tool of Examples 28 and 29 had as long a life as 45 minutes or more.

Examples 30-33

An (AlTiW)NO coating was formed on each milling insert and evaluated in the same manner as in Example 1, except for changing the average thickness of each (AlTiW)NO coating to 1 μm (Example 30), 6 μm (Example 31), 8 μm (Example 32) and 10 μm (Example 33) by adjusting the formation time. The composition of each (AlTiW)NO coating is shown in Table 11-1; the crystal structure measured by X-ray diffraction and electron beam diffraction and the existence of W—O bonds in each (AlTiW)NO coating, the average thickness of each coating, and the tool life are shown in Table 11-2. As is clear from Table 11-2, each hard-coated tool of Examples 30-33 had as long life as 40 minutes or more.

TABLE 11-1

(AlTiW)NO Coating Composition (atomic ratio)

| No. | Al (x) | Ti (y) | W (z) | AlTiW (a) | N (1-a-b) | O (b) |
|---|---|---|---|---|---|---|
| Example 1 | 0.71 | 0.20 | 0.09 | 0.48 | 0.44 | 0.08 |
| Example 30 | 0.72 | 0.20 | 0.08 | 0.49 | 0.43 | 0.08 |
| Example 31 | 0.69 | 0.21 | 0.10 | 0.43 | 0.48 | 0.09 |
| Example 32 | 0.69 | 0.22 | 0.09 | 0.47 | 0.46 | 0.07 |
| Example 33 | 0.70 | 0.20 | 0.10 | 0.50 | 0.42 | 0.08 |

TABLE 11-2

(AlTiW)NO Coating

| | Crystal Structure | | | | |
|---|---|---|---|---|---|
| No. | X-Ray Diffraction | Electron Beam Diffraction | W—O Bonds | Thickness (μm) | Tool Life (minute) |
| Example 1 | NaCl-type[1] | NaCl-type[2] | Yes | 3 | 55 |
| Example 30 | NaCl-type[1] | NaCl-type[2] | Yes | 1 | 45 |
| Example 31 | NaCl-type[1] | NaCl-type[2] | Yes | 6 | 51 |
| Example 32 | NaCl-type[1] | NaCl-type[2] | Yes | 8 | 47 |
| Example 33 | NaCl-type[1] | NaCl-type[2] | Yes | 10 | 40 |

Note:
[1]Single structure.
[2]Main structure.

Examples 34-49

To investigate the lamination effect of an (AlTiW)NO coating on the coating life, a coating of a composition A formed in the same manner as in Example 1, and a coating of a composition B formed in the same manner as in Example 1 except for using each target shown in Table 12-1 were alternately laminated on each milling insert as shown in Table 12-2, and evaluated in the same manner as in Example 1. The composition of each target used for forming the coating of the composition B, and the number of lamination in the laminate coating are shown in Table 12-1; the compositions of the layers A and B in each (AlTiW)NO laminate coating are shown in Table 12-2; and the crystal structures measured by X-ray diffraction and electron beam diffraction, the existence of W—O bonds, and the tool lives are shown in Table 12-3.

TABLE 12-1

| No. | Target Composition (atomic ratio) | Lamination Number of Coating |
|---|---|---|
| Example 34 | $(Al)_{0.70}(AlN)_{0.06}(Ti)_{0.13}(TiN)_{0.07}(WN)_{0.02}(WO_3)_{0.02}$ | 2 |
| Example 35 | | 4 |
| Example 36 | | 6 |
| Example 37 | | 8 |
| Example 38 | | 20 |
| Example 39 | | 100 |
| Example 40 | | 300 |
| Example 41 | | 500 |
| Example 42 | $(Al)_{0.06}(AlN)_{0.05}(Ti)_{0.10}(TiN)_{0.05}(WN)_{0.07}(WO_3)_{0.07}$ | 2 |
| Example 43 | | 4 |
| Example 44 | | 6 |
| Example 45 | | 8 |
| Example 46 | | 20 |

TABLE 12-1-continued

| No. | Target Composition (atomic ratio) | Lamination Number of Coating |
|---|---|---|
| Example 47 | | 100 |
| Example 48 | | 300 |
| Example 49 | | 500 |

TABLE 12-2

| No. | Coating | (AlTiW)NO Coating Composition (atomic ratio) | | | | | |
|---|---|---|---|---|---|---|---|
| | | Al (x) | Ti (y) | W (z) | AlTiW (a) | N (1-a-b) | O (b) |
| Example 34 | A | 0.69 | 0.20 | 0.11 | 0.51 | 0.41 | 0.08 |
| | B | 0.71 | 0.26 | 0.03 | 0.52 | 0.43 | 0.05 |
| Example 35 | A | 0.69 | 0.22 | 0.09 | 0.47 | 0.44 | 0.09 |
| | B | 0.69 | 0.29 | 0.02 | 0.44 | 0.50 | 0.06 |
| Example 36 | A | 0.70 | 0.20 | 0.10 | 0.45 | 0.47 | 0.08 |
| | B | 0.71 | 0.25 | 0.04 | 0.50 | 0.44 | 0.06 |
| Example 37 | A | 0.70 | 0.20 | 0.10 | 0.46 | 0.45 | 0.09 |
| | B | 0.72 | 0.24 | 0.03 | 0.44 | 0.53 | 0.03 |
| Example 38 | A | 0.70 | 0.22 | 0.08 | 0.44 | 0.47 | 0.09 |
| | B | 0.69 | 0.28 | 0.03 | 0.51 | 0.43 | 0.06 |
| Example 39 | A | 0.69 | 0.23 | 0.08 | 0.48 | 0.43 | 0.09 |
| | B | 0.71 | 0.25 | 0.04 | 0.46 | 0.50 | 0.04 |
| Example 40 | A | 0.69 | 0.24 | 0.07 | 0.44 | 0.47 | 0.09 |
| | B | 0.70 | 0.27 | 0.03 | 0.50 | 0.47 | 0.03 |
| Example 41 | A | 0.70 | 0.20 | 0.10 | 0.48 | 0.42 | 0.10 |
| | B | 0.72 | 0.26 | 0.02 | 0.51 | 0.46 | 0.03 |
| Example 42 | A | 0.70 | 0.21 | 0.09 | 0.51 | 0.42 | 0.07 |
| | B | 0.68 | 0.14 | 0.18 | 0.50 | 0.41 | 0.09 |
| Example 43 | A | 0.68 | 0.24 | 0.08 | 0.50 | 0.43 | 0.07 |
| | B | 0.70 | 0.13 | 0.17 | 0.51 | 0.40 | 0.09 |
| Example 44 | A | 0.69 | 0.23 | 0.08 | 0.49 | 0.43 | 0.08 |
| | B | 0.71 | 0.10 | 0.19 | 0.46 | 0.44 | 0.10 |
| Example 45 | A | 0.70 | 0.20 | 0.10 | 0.50 | 0.43 | 0.07 |
| | B | 0.71 | 0.11 | 0.18 | 0.44 | 0.48 | 0.08 |
| Example 46 | A | 0.68 | 0.24 | 0.08 | 0.48 | 0.45 | 0.07 |
| | B | 0.69 | 0.12 | 0.19 | 0.50 | 0.41 | 0.09 |
| Example 47 | A | 0.71 | 0.21 | 0.08 | 0.45 | 0.48 | 0.07 |
| | B | 0.70 | 0.10 | 0.20 | 0.50 | 0.40 | 0.10 |
| Example 48 | A | 0.72 | 0.21 | 0.07 | 0.45 | 0.48 | 0.07 |
| | B | 0.69 | 0.14 | 0.17 | 0.52 | 0.38 | 0.10 |
| Example 49 | A | 0.70 | 0.22 | 0.08 | 0.51 | 0.42 | 0.07 |
| | B | 0.69 | 0.12 | 0.19 | 0.50 | 0.42 | 0.08 |

TABLE 12-3

| No. | (AlTiW)NO Coating | | | |
|---|---|---|---|---|
| | Crystal Structure | | W—O Bonds | Tool Life (minute) |
| | X-Ray Diffraction | Electron Beam Diffraction | | |
| Example 34 | NaCl-type[1] | NaCl-type[2] | Yes | 51 |
| Example 35 | NaCl-type[1] | NaCl-type[2] | Yes | 47 |
| Example 36 | NaCl-type[1] | NaCl-type[2] | Yes | 46 |
| Example 37 | NaCl-type[1] | NaCl-type[2] | Yes | 42 |
| Example 38 | NaCl-type[1] | NaCl-type[2] | Yes | 40 |
| Example 39 | NaCl-type[1] | NaCl-type[2] | Yes | 40 |
| Example 40 | NaCl-type[1] | NaCl-type[2] | Yes | 43 |
| Example 41 | NaCl-type[1] | NaCl-type[2] | Yes | 49 |
| Example 42 | NaCl-type[1] | NaCl-type[2] | Yes | 52 |
| Example 43 | NaCl-type[1] | NaCl-type[2] | Yes | 49 |
| Example 44 | NaCl-type[1] | NaCl-type[2] | Yes | 47 |
| Example 45 | NaCl-type[1] | NaCl-type[2] | Yes | 45 |
| Example 46 | NaCl-type[1] | NaCl-type[2] | Yes | 42 |
| Example 47 | NaCl-type[1] | NaCl-type[2] | Yes | 45 |
| Example 48 | NaCl-type[1] | NaCl-type[2] | Yes | 48 |
| Example 49 | NaCl-type[1] | NaCl-type[2] | Yes | 51 |

Note:
[1] Single structure.
[2] Main structure.

As is clear from Table 12-3, each tool of Examples 34-49 had as long a life as 40 minutes or more.

Examples 50-61

To investigate the influence of an intermediate layer on the coating life, an (AlTiW)NO coating was formed on each milling insert and evaluated in the same manner as in Example 1, except that each intermediate layer was formed between the same modified layer and the same (AlTiW)NO coating as in Example 1, by physical vapor deposition under the conditions shown in Tables 13-1 and 13-2, using each target having the composition shown in Table 13-1. The composition of each (AlTiW)NO coating is shown in Table 14-1, and the crystal structure measured by X-ray diffraction and electron beam diffraction and the existence of W—O bonds in each (AlTiW)NO coating, and the tool life are shown in Table 14-2.

TABLE 13-1

| No. | Conditions of Forming Intermediate Layer | | |
|---|---|---|---|
| | Target Composition (atomic ratio) | Arc Current[1] (A) | DC Bias Voltage[2] (V) |
| Example 50 | $Ti_{1.00}$ | 145 | −45 |
| Example 51 | $Ti_{0.54}Al_{0.46}$ | 110 | −45 |
| Example 52 | $Ti_{0.79}Si_{0.21}$ | 140 | −45 |
| Example 53 | $Ti_{0.90}B_{0.10}$ | 140 | −45 |
| Example 54 | $Ti_{0.52}Al_{0.40}Cr_{0.08}$ | 110 | −45 |
| Example 55 | $Ti_{0.49}Al_{0.43}Nb_{0.08}$ | 100 | −45 |
| Example 56 | $Ti_{0.53}Al_{0.41}W_{0.06}$ | 130 | −45 |
| Example 57 | $Ti_{0.85}C_{0.15}$ | 140 | −45 |
| Example 58 | $Ti_{0.55}Al_{0.45}$ | 110 | −45 |
| Example 59 | $Al_{0.72}Cr_{0.28}$ | 90 | −85 |
| Example 60 | $Al_{0.75}Cr_{0.25}$ | 90 | −45 |
| Example 61 | $Al_{1.00}$ | 50 | −85 |

Note:
[1] Arc current at the arc discharge evaporation source.
[2] The peak value of negative bias voltage at the DC bias power source.

TABLE 13-2

| No. | Conditions of Forming Intermediate Layer | | Composition of Intermediate Layer |
|---|---|---|---|
| | Substrate Temperature (° C.) | Thickness (μm) | |
| Example 50 | 500 | 0.5 | TiN |
| Example 51 | 500 | 0.5 | (TiAl)N[3] |
| Example 52 | 500 | 0.5 | (TiSi)N |
| Example 53 | 500 | 0.5 | (TiB)N |
| Example 54 | 500 | 0.5 | (TiAlCr)N[3] |
| Example 55 | 500 | 0.5 | (TiAlNb)N[3] |
| Example 56 | 500 | 0.5 | (TiAlW)N[3] |
| Example 57 | 500 | 0.5 | Ti(CN) |

TABLE 13-2-continued

| No. | Conditions of Forming Intermediate Layer | | Composition of Intermediate Layer |
|---|---|---|---|
| | Substrate Temperature (° C.) | Thickness (μm) | |
| Example 58 | 500 | 0.5 | (TiAl)CNO[3] |
| Example 59 | 600 | 0.5 | (AlCr)$_2$O$_3$ |
| Example 60 | 550 | 0.5 | (AlCr)N |
| Example 61 | 600 | 0.5 | Al$_2$O$_3$ |

Note:
[3] The same X-ray diffraction measurement as in Example 1 indicated only a NaCl-type structure.

TABLE 14-1

| | (AlTiW)NO Coating Composition (atomic ratio) | | | | | |
|---|---|---|---|---|---|---|
| No. | Al (x) | Ti (y) | W (z) | AlTiW (a) | N (1-a-b) | O (b) |
| Example 1 | 0.71 | 0.20 | 0.09 | 0.48 | 0.44 | 0.08 |
| Example 50 | 0.70 | 0.21 | 0.09 | 0.47 | 0.44 | 0.09 |
| Example 51 | 0.72 | 0.19 | 0.09 | 0.45 | 0.47 | 0.08 |
| Example 52 | 0.71 | 0.18 | 0.11 | 0.44 | 0.46 | 0.10 |
| Example 53 | 0.71 | 0.19 | 0.10 | 0.46 | 0.45 | 0.09 |
| Example 54 | 0.69 | 0.21 | 0.10 | 0.48 | 0.43 | 0.09 |
| Example 55 | 0.69 | 0.21 | 0.10 | 0.45 | 0.47 | 0.08 |
| Example 56 | 0.72 | 0.19 | 0.09 | 0.45 | 0.47 | 0.08 |
| Example 57 | 0.70 | 0.20 | 0.10 | 0.43 | 0.47 | 0.10 |
| Example 58 | 0.70 | 0.20 | 0.10 | 0.42 | 0.49 | 0.09 |
| Example 59 | 0.69 | 0.21 | 0.10 | 0.44 | 0.48 | 0.08 |
| Example 60 | 0.70 | 0.20 | 0.10 | 0.46 | 0.45 | 0.09 |
| Example 61 | 0.69 | 0.20 | 0.11 | 0.46 | 0.45 | 0.09 |

TABLE 14-2

| | (AlTiW)NO Coating | | | |
|---|---|---|---|---|
| | Crystal Structure | | | |
| No. | X-Ray Diffraction | Electron Beam Diffraction | W—O Bonds | Tool Life (minute) |
| Example 1 | NaCl-type[1] | NaCl-type[2] | Yes | 55 |
| Example 50 | NaCl-type[1] | NaCl-type[2] | Yes | 55 |
| Example 51 | NaCl-type[1] | NaCl-type[2] | Yes | 48 |
| Example 52 | NaCl-type[1] | NaCl-type[2] | Yes | 52 |
| Example 53 | NaCl-type[1] | NaCl-type[2] | Yes | 55 |
| Example 54 | NaCl-type[1] | NaCl-type[2] | Yes | 49 |
| Example 55 | NaCl-type[1] | NaCl-type[2] | Yes | 49 |
| Example 56 | NaCl-type[1] | NaCl-type[2] | Yes | 49 |
| Example 57 | NaCl-type[1] | NaCl-type[2] | Yes | 50 |
| Example 58 | NaCl-type[1] | NaCl-type[2] | Yes | 50 |
| Example 59 | NaCl-type[1] | NaCl-type[2] | Yes | 51 |
| Example 60 | NaCl-type[1] | NaCl-type[2] | Yes | 51 |
| Example 61 | NaCl-type[1] | NaCl-type[2] | Yes | 47 |

Note:
[1] Single structure.
[2] Main structure.

In Examples 50-61, in which each intermediate layer (hard coating) comprising as indispensable constituent elements at least one metal element selected from the group consisting of elements in Groups 4a, 5a and 6a, Al and Si, and at least one selected from the group consisting of B, O, C and N was formed by physical vapor deposition between the WC-based cemented carbide substrate and the (AlTiW)NO coating, any tools had lives of 47 minutes or more as is clear from Table 14-2.

Examples 62-66

(1) Cleaning of Substrate

A turning insert substrate of WC-based cemented carbide having a composition comprising 6% by mass of Co, the balance being WC and inevitable impurities (CNMG120408 available from Hitachi Tool Engineering, Ltd.), and the same property-measuring insert substrate as in Example 1 were set on a holder 8 in the AI apparatus shown in FIG. 1, and heated to 600° C. by a heater (not shown) while evacuating to vacuum. Thereafter, an argon gas of 500 sccm was introduced into the vacuum chamber 5 to adjust the pressure to 2.0 Pa, and negative DC bias voltage of −200 V was applied to each substrate to carry out cleaning by etching with argon ion bombardment.

(2) Formation of Modified Layer Using TiO Target

A modified layer was formed on each cleaned substrate in the same manner as in Example 1.

(3) Formation of (ATiW)NO Coating

An (AlTiW)NO coating was formed on each substrate having the modified layer in the same manner as in Example 1.

(4) Formation of (AlCr)NO Coating

Using an AlCr target (Al: 50 atomic %, and Cr: 50 atomic %), an (AlCr)NO coating was formed on each (AlTiW)NO coating, with unipolar pulse bias voltage of −40 V (frequency: 20 kHz) applied to each substrate at a substrate temperature of 600° C. and DC arc current of 120 A for 5 minutes. A nitrogen gas was supplied at 700 sccm at an initial coating stage, with its flow rate gradually lowering to 200 sccm over 5 minutes, and reaching 200 sccm at a terminating stage. An oxygen gas was introduced into the AI furnace, with its flow rate gradually increased from 10 sccm at the initial coating stage to 500 sccm over 20 minutes, and reaching 500 sccm at the terminating stage. The pressure of the atmosphere gas was 3 Pa during forming the coating, to form an (AlCr)NO coating having a composition of $(Al_{0.52}Cr_{0.48})_{0.46}(N_{0.42}O_{0.58})_{0.54}$ (atomic ratio) and an average thickness of 0.5 μm. Table 15 shows the composition of each (AlCr)NO coating.

TABLE 15-1

| | Type of | Thickness | Composition (atomic %) | | | |
|---|---|---|---|---|---|---|
| No. | Coating | (μm) | Al | Cr | N | O |
| Example 62 | (AlCr)NO | 0.5 | 23.5 | 22.0 | 22.7 | 31.8 |
| Example 63 | (AlCr)NO | 0.5 | 23.5 | 22.0 | 22.7 | 31.8 |
| Example 64 | (AlCr)NO | 0.5 | 23.5 | 22.0 | 22.7 | 31.8 |
| Example 65 | (AlCr)NO | 0.5 | 23.5 | 22.0 | 22.7 | 31.8 |
| Example 66 | (AlCr)NO | 0.5 | 23.5 | 22.0 | 22.7 | 31.8 |

TABLE 15-2

| No. | h Al | i Cr | j N | k O | c | d |
|---|---|---|---|---|---|---|
| Example 62 | 0.52 | 0.48 | 0.42 | 0.58 | 0.46 | 0.54 |
| Example 63 | 0.52 | 0.48 | 0.42 | 0.58 | 0.46 | 0.54 |
| Example 64 | 0.52 | 0.48 | 0.42 | 0.58 | 0.46 | 0.54 |
| Example 65 | 0.52 | 0.48 | 0.42 | 0.58 | 0.46 | 0.54 |
| Example 66 | 0.52 | 0.48 | 0.42 | 0.58 | 0.46 | 0.54 |

(5) Formation of (AlCr)$_2$O$_3$ Coating

Using each AlCr target shown in Table 16-2, an (AlCr)$_2$O$_3$ coating having an average thickness of 1.5 μm was then continuously formed as an upper layer on each (AlCr)NO coating under the conditions shown in Tables 16-1 and 16-2. The compositions and crystal structures of the (AlCr)$_2$O$_3$ coatings are shown in Table 17.

TABLE 16-1

| No. | Forming Temperature (° C.) | Pulse Bias Voltage Voltage (V) | Pulse Bias Voltage Frequency (kHz) | Arc Current (A) |
|---|---|---|---|---|
| Example 62 | 600 | −20 | 20 | 120 |
| Example 63 | 600 | −20 | 20 | 120 |
| Example 64 | 600 | −20 | 20 | 120 |
| Example 65 | 600 | −100 | 20 | 120 |
| Example 66 | 600 | −30 | 25 | 120 |

TABLE 16-2

| No. | Amount of Gas Introduced (sccm) Oxygen | Amount of Gas Introduced (sccm) Argon | Gas Pressure (Pa) | Target Composition (atomic %) |
|---|---|---|---|---|
| Example 62 | 300 | 100 | 2 | $Al_{27}Cr_{73}$ |
| Example 63 | 300 | 100 | 7 | $Al_{45}Cr_{55}$ |
| Example 64 | 300 | 100 | 2 | $Al_{64}Cr_{36}$ |
| Example 65 | 300 | 100 | 2 | $Al_{73}Cr_{27}$ |
| Example 66 | 300 | 100 | 2 | $Al_{27}Cr_{73}$ |

TABLE 17

| No. | Type of Upper Layer | Thickness (μm) | Composition (atomic %) Al | Composition (atomic %) Cr | Composition (atomic %) O | Crystal Structure |
|---|---|---|---|---|---|---|
| Example 62 | $(AlCr)_2O_3$ | 1.5 | 0.10 | 0.30 | 0.60 | α |
| Example 63 | $(AlCr)_2O_3$ | 1.5 | 0.16 | 0.24 | 0.60 | α |
| Example 64 | $(AlCr)_2O_3$ | 1.5 | 0.24 | 0.16 | 0.60 | α |
| Example 65 | $(AlCr)_2O_3$ | 1.5 | 0.28 | 0.12 | 0.60 | α |
| Example 66 | $(AlCr)_2O_3$ | 1.5 | 0.10 | 0.30 | 0.60 | γ |

(6) Evaluation of Tool Life

An (AlCr)NO coating and an $(AlCr)_2O_3$ coating were formed successively on each of the resultant (AlTiW)NO coatings, to obtain a hard-coated turning insert. Using each turning tool to which the inserts were attached, cutting by turning was conducted under the following conditions, to examine the peeling of the coating, the wear of a flank, chipping, etc. The peeling of the (AlTiW)NO coating, the (AlCr)NO coating and the $(AlCr)_2O_3$ coating was examined by observing the coating of an insert sampled every unit time during turning by an optical microscope (magnification: 100 times). In cutting by turning, the shortest cutting time until the maximum wear width of a flank exceeded 0.30 mm, until the (AlTiW)NO coating peeled, or until the (AlTiW)NO coating was chipped, was regarded as a tool life. The composition of each (AlTiW)NO coating, the crystal structure measured by X-ray diffraction and electron beam diffraction, the existence of W—O bonds, and the tool life are shown in Tables 18-1 and 18-2.

Cutting conditions

| | |
|---|---|
| Work: | SUS630, |
| Cutting method: | Continuous turning, |
| Tool shape: | CNMG120408, |
| Cutting speed: | 140 m/minute, |
| Feed: | 0.23 mm/rotation, |
| Cutting depth: | 1.5 mm, and |
| Cutting liquid: | Water-soluble cutting oil. |

Example 67

A turning insert having no $(AlCr)_2O_3$ coating on the (AlTiW)NO coating formed in the same manner as in Example 62 was evaluated. The composition of each (AlTiW)NO coating, the crystal structure measured by X-ray diffraction and electron beam diffraction and the existence of W—O bonds in each (AlTiW)NO coating, and the tool life are shown in Tables 18-1 and 18-2.

Comparative Example 22

An (AlTiW)NO-coated insert produced in the same manner as in Example 62 except for forming the same (AlTiW) NO coating as in Comparative Example 3 was evaluated. The composition of each (AlTiW)NO coating is shown in Table 18-1, and the crystal structure measured by X-ray diffraction and electron beam diffraction and the existence of W—O bonds in each (AlTiW)NO coating, and the tool life are shown in Table 18-2.

TABLE 18-1

| | (AlTiW)NO Coating Composition (atomic ratio) | | | | | |
|---|---|---|---|---|---|---|
| No. | Al (x) | Ti (y) | W (z) | AlTiW (a) | N (1-a-b) | O (b) |
| Example 62 | 0.70 | 0.20 | 0.10 | 0.48 | 0.41 | 0.11 |
| Example 63 | 0.71 | 0.20 | 0.09 | 0.45 | 0.46 | 0.09 |
| Example 64 | 0.69 | 0.21 | 0.10 | 0.47 | 0.44 | 0.09 |
| Example 65 | 0.70 | 0.22 | 0.08 | 0.43 | 0.48 | 0.09 |
| Example 66 | 0.70 | 0.20 | 0.10 | 0.48 | 0.43 | 0.09 |
| Example 67 | 0.72 | 0.20 | 0.08 | 0.45 | 0.47 | 0.08 |
| Com. Ex. 22 | 0.53 | 0.42 | 0.05 | 0.54 | 0.42 | 0.04 |

TABLE 18-2

| | (AlTiW)NO Coating | | | |
|---|---|---|---|---|
| | Crystal Structure | | | |
| No. | X-Ray Diffraction | Electron Beam Diffraction | W—O Bonds | Tool Life (minute) |
| Example 62 | NaCl-type[1] | NaCl-type[2] | Yes | 35 |
| Example 63 | NaCl-type[1] | NaCl-type[2] | Yes | 38 |
| Example 64 | NaCl-type[1] | NaCl-type[2] | Yes | 40 |
| Example 65 | NaCl-type[1] | NaCl-type[2] | Yes | 45 |
| Example 66 | NaCl-type[1] | NaCl-type[2] | Yes | 38 |
| Example 67 | NaCl-type[1] | NaCl-type[2] | Yes | 30 |
| Com. Ex. 22 | NaCl-type[1] | NaCl-type[2] | Yes | 20 |

Note:
[1]Single structure.
[2]Main structure.

As is clear from Table 18-2, each insert of Examples 62-66 having an upper $(AlCr)_2O_3$ layer formed on the same (AlTiW)NO coating as in Example 1 had as long a tool life as 38 minutes or more, and the turning insert of Example 67 having no upper $(AlCr)_2O_3$ layer had a tool life shorter than those of Examples 62-66 but longer than that of Comparative Example 22.

Example 68

An (AlTiW)NO coating was formed in the same manner as in Example 1 except for forming no modified layer on the same WC-based cemented carbide substrate as in Example 1, and evaluated. As a result, the tool life was 31 minutes, longer than the tool life (23 minutes) of Comparative Example 16, in which the (AlTiW)NO coating was formed on a WC-based cemented carbide substrate having a modified layer, while supplying pulse arc current having a frequency of 0.5 kHz to the target.

Example 69

In the AI apparatus shown in FIG. 1, a high-feed milling insert substrate and a property-measuring insert substrate each made of the same WC-based cemented carbide as in Example 1 was subjected to cleaning with Ar ions in the same manner as in Example 1. With the temperature of each substrate elevated to 610° C., and the flow rate of an argon gas set at 50 sccm, a target 10 having a composition represented by $Ti_{0.8}B_{0.2}$(atomic ratio) was attached to an arc discharge evaporation source 13 connected to an arc discharge power source 11. With negative DC voltage of −750 V applied to each substrate by the bias power source 3, and DC arc current of 80 A supplied from the arc discharge power source 11 to the target 10, a modified layer having an average thickness of 5 nm was formed. Subsequently, an (AlTiW)NO coating was formed on the milling insert and evaluated in the same manner as in Example 1. As a result, the tool life was 63 minutes, longer than in Example 1 (55 minutes).

Though Examples above used the targets of the present invention containing $WO_3$ as tungsten oxide without intention of restriction, the targets of the present invention containing $WO_2$ or $WO_3$ and $WO_2$ as tungsten oxide can provide substantially the same effects as in Examples above.

DESCRIPTION OF SYMBOLS

1: Driving means
2: Gas inlet
3: Bias power source
4: Bearing
5: Vacuum chamber
6: Lower holder (support)
7: Substrate
8: Upper holder
10: Cathode material (target)
11, 12: Arc discharge power source
13, 27: Arc discharge evaporation source
14: Insulator for fixing arc discharge evaporation source
15: Bearing for arc ignition mechanism
16: Arc ignition mechanism
17: Gas outlet
18: Cathode material (target)
19: Electrode-fixing insulator
20: Electrode
21: Shield plate bearing
22: Shield plate-operating means
23: Shield plate
30: Milling insert
35: Main cutting edge of insert
36: Tool body
37: Insert-fixing screw
38: Tip end portion of tool body
40: Indexable rotary cutting tool
41: WC-based cemented carbide substrate
42: (AlTiW)NO coating
43: Modified layer

What is claimed is:

1. An arc-ion-plated hard coating having a composition represented by $(Al_xTi_yW_z)_aN_{(1-a-b)}O_b$, wherein x, y, z, a and b are numbers meeting by atomic ratio $0.6 \leq x \leq 0.8$, $0.05 \leq y \leq 0.38$, $0.02 \leq z \leq 0.2$, $x+y+z=1$, $0.2 \leq a \leq 0.8$, and $0.02 \leq b \leq 0.10$;

said hard coating having W—O bonds with substantially no Al—O bonds when identified by X-ray photoelectron spectroscopy, and only a NaCl structure in an X-ray diffraction pattern.

2. The hard coating according to claim 1, which has a NaCl structure as a main structure, and a wurtzite structure as a sub-structure, in an electron beam diffraction pattern.

3. A hard-coated member comprising the hard coating recited in claim 1 formed on a substrate.

4. The hard-coated member according to claim 3, wherein an intermediate layer indispensably comprising at least one metal element selected from elements in Groups 4a, 5a and 6a, Al and Si, and at least one element selected from B, O, C and N is formed by physical vapor deposition between said substrate and said hard coating.

5. The hard-coated member according to claim 3, wherein an oxynitride layer having a composition represented by $(Al_hCr_i)_c(N_jO_k)_d$, wherein $h=0.1-0.6$, $h+i=1$, $j=0.1-0.8$, $j+k=1$, $c=0.35-0.6$, and $c+d=1$ by atomic ratio, is formed on said hard coating; and wherein an oxide layer having a composition represented by $(Al_mCr_n)_2O_3$, wherein $m=0.1-0.6$, and $m+n=1$ by atomic ratio is formed by physical vapor deposition on said oxynitride layer having a composition represented by $(Al_hCr_i)_c(N_jO_k)_d$.

6. A target used for producing the hard coating recited in claim 1, which is a sintered body having a composition represented by $(Al)_p(AlN)_q(Ti)_r(TiN)_s(WN)_t(WOx)_u$, wherein p, q, r, s, t and u are numbers meeting by atomic ratio $0.59 \leq p \leq 0.8$, $0.01 \leq q \leq 0.1$, $0.04 \leq r \leq 0.35$, $0.03 \leq s \leq 0.15$, $0.01 \leq t \leq 0.20$, $0.01 \leq u \leq 0.1$, and $p+q+r+s+t+u=1$, and x is a number of 2-3 by atomic ratio.

7. The target according to claim 6, wherein said sintered body is obtained by hot-pressing mixed powder of AlTi alloy powder, AN powder, TiN powder, WN powder, and $WO_3$ powder and/or $WO_2$ powder in vacuum.

8. A method for producing a hard-coated member comprising a hard coating on a substrate by arc ion plating; said hard coating having a composition represented by $(Al_xTi_yW_z)_aN_{(1-a-b)}O_b$, wherein x, y, z, a and b are numbers meeting by atomic ratio $0.6 \leq x \leq 0.8$, $0.05 \leq y \leq 0.38$, $0.02 \leq z \leq 0.2$, $x+y+z=1$, $0.2 \leq a \leq 0.8$, and $0.02 \leq b \leq 0.10$, and having W—O bonds with substantially no Al—O bonds when identified by X-ray photoelectron spectroscopy, and only a NaCl structure in an X-ray diffraction pattern; comprising applying DC bias voltage or unipolar pulse bias voltage of −270 V to −20 V to said substrate, and supplying pulse arc current to an AlTi alloy target comprising Al nitride, Ti nitride, W nitride and W oxide, which is attached to an arc discharge evaporation source, to form said hard coating on said substrate kept at a temperature of 400-550° C. in a nitriding gas atmosphere; and said pulse arc current having a substantially rectangular waveform with the maximum arc current of 90-120 A and the minimum arc current of 50-90 A, the difference between said maximum arc current and said minimum arc current being 10 A or more, a frequency of 2-15 kHz, and a duty ratio of 40-70%.

9. The method for producing a hard-coated member according to claim 8, wherein said target has a composition represented by $(Al)_p(AlN)_q(Ti)_r(TiN)_s(WN)_t(WOx)_u$, wherein p, q, r, s, t and u are numbers meeting by atomic ratio $0.59 \leq p \leq 0.8$, $0.01 \leq q \leq 0.1$, $0.04 \leq r \leq 0.35$, $0.03 \leq s \leq 0.15$, $0.01 \leq t \leq 0.20$, $0.01 \leq u \leq 0.1$, and $p+q+r+s+t+u=1$, and x is a number of 2-3 by atomic ratio.

10. The method for producing a hard-coated member according to claim 8, wherein said substrate is made of cemented carbide containing WC as a main component; and wherein before said hard coating is formed, negative DC voltage of −850 V to −500 V is applied to said substrate kept at a temperature of 400-700° C. in an argon gas atmosphere having a flow rate of 30-150 sccm, and arc current of 50-100 A is supplied to a target having a composition of $Ti_eO_{1-e}$, wherein e is a number representing the atomic ratio of Ti and meeting $0.7 \leq e \leq 0.95$, which is attached to an arc discharge evaporation source, thereby bombarding a surface of said substrate with ions generated from said target.

11. The method for producing a hard-coated member according to claim 8, wherein said substrate is made of cemented carbide containing WC as a main component; and wherein before said hard coating is formed, negative DC voltage of −1000 V to −600 V is applied to said substrate kept at a temperature of 450-750° C. in an argon gas atmosphere having a flow rate of 30-150 sccm, and arc current of 50-100 A is supplied to a target having a composition of $Ti_fB_{1-f}$, wherein f is a number representing the atomic ratio of Ti and meeting $0.5 \leq f \leq 0.9$, which is attached to an arc discharge evaporation source, thereby bombarding a surface of said substrate with ions generated from said target.

* * * * *